(12) United States Patent
Fujii et al.

(10) Patent No.: US 9,680,094 B2
(45) Date of Patent: Jun. 13, 2017

(54) MEMORY DEVICE AND METHOD FOR MANUFACTURING THE SAME

(71) Applicants: Shosuke Fujii, Kanagawa-ken (JP);
Takashi Haimoto, Tokyo (JP)

(72) Inventors: Shosuke Fujii, Kanagawa-ken (JP);
Takashi Haimoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/716,347

(22) Filed: Dec. 17, 2012

(65) Prior Publication Data

US 2014/0061570 A1 Mar. 6, 2014

Related U.S. Application Data

(60) Provisional application No. 61/695,075, filed on Aug. 30, 2012.

(51) Int. Cl.
*H01L 45/00* (2006.01)
*H01L 27/24* (2006.01)

(52) U.S. Cl.
CPC ...... *H01L 45/1266* (2013.01); *H01L 27/2472* (2013.01); *H01L 27/2481* (2013.01); *H01L 45/085* (2013.01); *H01L 45/126* (2013.01); *H01L 45/1233* (2013.01); *H01L 45/148* (2013.01); *H01L 45/16* (2013.01)

(58) Field of Classification Search
CPC ....... H01L 45/04; H01L 45/08; H01L 45/085; H01L 45/1253; H01L 45/1266; H01L 45/1233; H01L 27/2463; H01L 27/2409; H01L 27/2481; H01L 27/2472; G11C 13/0002; G02F 1/134309
USPC .......................................................... 257/2–4
See application file for complete search history.

(56) References Cited

U.S. PATENT DOCUMENTS

| | | | | |
|---|---|---|---|---|
| 2002/0197935 A1* | 12/2002 | Mueller | ................... | C09G 1/02 451/36 |
| 2006/0076549 A1* | 4/2006 | Ufert | ................... | 257/3 |
| 2006/0285375 A1* | 12/2006 | Endo | ................... | G11C 16/0483 365/63 |
| 2007/0205248 A1* | 9/2007 | Horng et al. | ................... | 228/19 |

(Continued)

OTHER PUBLICATIONS

U.S. Appl. No. 14/022,732, filed Sep. 10, 2013, Ishikawa, et al.

(Continued)

*Primary Examiner* — Matthew Reames
*Assistant Examiner* — John Bodnar
(74) *Attorney, Agent, or Firm* — Oblon, McClelland, Maier & Neustadt, L.L.P.

(57) ABSTRACT

According to one embodiment, a memory device includes a first electrode, a first resistance change layer, a first insulating section, a second electrode and an intermediate layer. The first resistance change layer is provided on the first electrode. The first insulating section is provided on the first resistance change layer. The second electrode is provided on the first resistance change layer. The second electrode is in contact with the first resistance change layer. The intermediate layer is provided between the second electrode and the first insulating section. The intermediate layer is in contact with the second electrode and the first insulating section.

18 Claims, 23 Drawing Sheets

(56) References Cited

U.S. PATENT DOCUMENTS

| | | | |
|---|---|---|---|
| 2008/0217670 A1* | 9/2008 | Dahmani | H01L 45/085 257/296 |
| 2008/0280390 A1* | 11/2008 | Kim | H01L 27/2409 438/95 |
| 2010/0207168 A1* | 8/2010 | Sills | H01L 27/2463 257/202 |
| 2011/0215436 A1* | 9/2011 | Tang | H01L 21/762 257/506 |
| 2012/0007037 A1* | 1/2012 | Ramaswamy | H01L 27/24 257/5 |
| 2012/0043621 A1* | 2/2012 | Herner | 257/401 |
| 2012/0060911 A1* | 3/2012 | Fu et al. | 136/256 |
| 2012/0091428 A1* | 4/2012 | Miyata | H01L 45/085 257/5 |
| 2012/0138884 A1* | 6/2012 | Tian et al. | 257/4 |
| 2013/0075689 A1* | 3/2013 | Herner | H01L 45/16 257/5 |
| 2013/0092894 A1* | 4/2013 | Sills et al. | 257/4 |
| 2013/0187121 A1* | 7/2013 | Ramaswamy | H01L 27/24 257/5 |
| 2014/0061565 A1* | 3/2014 | Nishihara | 257/2 |

OTHER PUBLICATIONS

Sung Hyun Jo et al. "CMOS Compatible Nanoscale Nonvolatile Resistance Switching Memory", Nano Letters, vol. 8. No. 2, 2008, pp. 392-397.

* cited by examiner

MEMORY DEVICE AND METHOD FOR MANUFACTURING THE SAME

CROSS-REFERENCE TO RELATED APPLICATIONS

This application is based upon and claims the benefit of priority from the prior U.S. Provisional Patent Application 61/695,075, filed on Aug. 30, 2012; the entire contents of which are incorporated herein by reference.

FIELD

Embodiments described herein relate generally to a memory device and a method for manufacturing the same.

BACKGROUND

Among memory devices, the NAND flash memory, for instance, is widely used as a memory device for storing large volumes of data. In memory devices, in order to reduce cost per bit and to increase the capacity, miniaturization of the memory element is advanced. Among memory devices, the two-terminal nonvolatile resistance change element is promising as a high capacity memory device from the viewpoint of low voltage operation, high speed switching, miniaturizability and the like. In such a memory device, improvement of reliability is important.

DETAILED DESCRIPTION

Figure 1A:
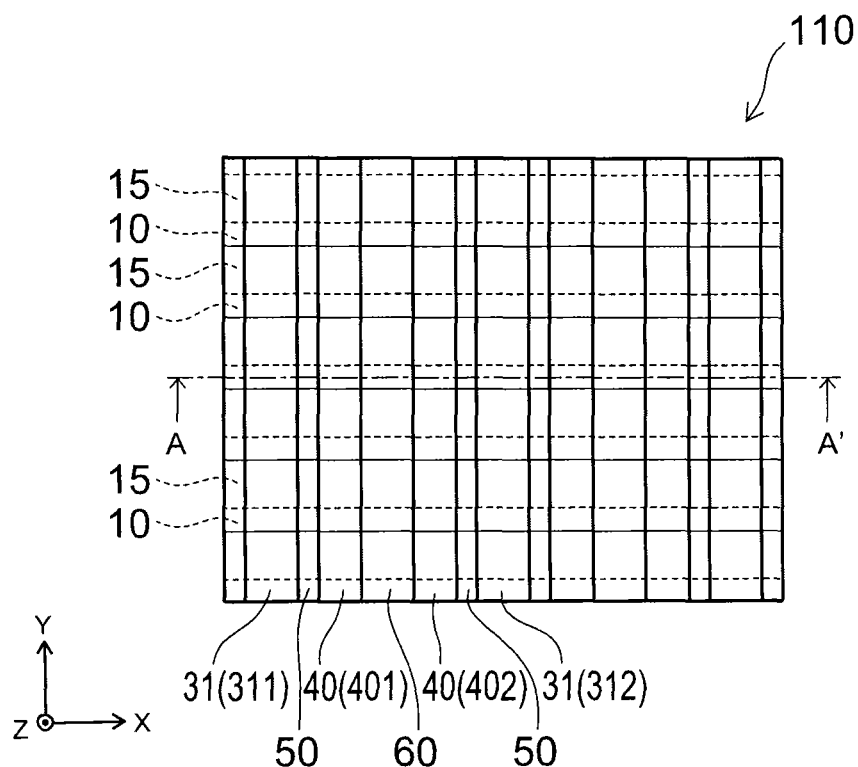
FIGS. 1A and 1B are schematic views illustrating a memory device according to a first embodiment.

In general, according to one embodiment, a memory device includes a first electrode, a first resistance change layer, a first insulating section, a second electrode and an intermediate layer. The first resistance change layer is provided on the first electrode. The first insulating section is provided on the first resistance change layer. The second electrode is provided on the first resistance change layer. The second electrode is in contact with the first resistance change layer. The intermediate layer is provided between the second electrode and the first insulating section. The intermediate layer is in contact with the second electrode and the first insulating section.

Various embodiments will be described hereinafter with reference to the accompanying drawings. In the following description, like members are labeled with like reference numerals. The description of the members once described is omitted appropriately.

First Embodiment

Figure 1B:
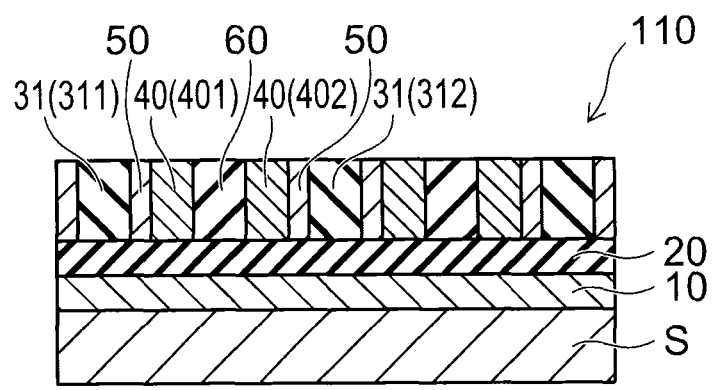

FIGS. 1A and 1B are schematic views illustrating a memory device according to a first embodiment.

FIG. 1A shows a schematic plan view of the memory device 110 according to the first embodiment. FIG. 1B shows a schematic sectional view taken along line A-A' shown in FIG. 1A.

As shown in FIGS. 1A and 1B, the memory device 110 includes a first electrode 10, a first resistance change layer 20, a first insulating section 31, a second electrode 40, and an intermediate layer 50. The memory device 110 is e.g. a cross-point nonvolatile memory. The memory device 110 is e.g. a CBRAM (conductive bridging RAM).

The first electrode 10 is provided on e.g. a substrate S. The substrate S is e.g. a semiconductor substrate. On the substrate S, elements such as transistors are formed. The first electrode 10 is formed on the substrate S via an interlayer insulating film, not shown. The first electrode 10 extends in the X direction (first direction). For instance, the first electrode 10 is provided in a plurality. The plurality of first electrodes 10 are spaced in the Y direction (second direction) non-parallel (e.g., orthogonal) to the X direction. Between the plurality of first electrodes 10, an insulating film 15 is provided. The plurality of first electrodes 10 are formed like stripes. For the first electrode 10, for instance, titanium nitride (TiN), tungsten (W), and a stacked structure thereof are used.

The first resistance change layer 20 is provided on the first electrode 10. In this embodiment, the direction connecting the first electrode 10 and the first resistance change layer 20 is referred to as the Z direction (third direction). Furthermore, in this embodiment, the orientation from the first electrode 10 toward the first resistance change layer 20 is referred to as upward (upper side), and the opposite is referred to as downward (lower side).

The first resistance change layer 20 has the function of transitioning between different resistance states. The resistance states include a relatively high resistance state (high resistance state) and a relatively low resistance state (low resistance state). The first resistance change layer 20 transitions between the high resistance state and the low resistance state by application of a prescribed voltage. For the first resistance change layer 20, for instance, amorphous silicon, silicon oxide ($SiO_2$), and a stacked structure thereof are used.

The first insulating section 31 is provided on the first resistance change layer 20. The first insulating section 31 is provided like a pillar. The first insulating section 31 extends in the Y direction. For instance, the first insulating section 31 is provided in a plurality. The plurality of first insulating sections 31 are spaced in the X direction. Among the plurality of first insulating sections 31, two adjacent ones are first insulating sections 31 (311) and 31 (312). For the first insulating section 31, for instance, silicon nitride (SiN), carbon-doped silicon oxide (SiOC), and organic insulating film are used.

The second electrode 40 is provided on the first resistance change layer 20. The second electrode 40 is in contact with the first resistance change layer 20. The second electrode 40 extends in the Y direction. Among a plurality of second electrodes 40, two adjacent ones are second electrodes 40 (401) and 40 (402). The second electrode 40 contains a metal serving as an ion source of ions to be supplied to the first resistance change layer 20. The second electrode 40 contains at least one selected from the group consisting of e.g. silver (Ag), copper (Cu), nickel (Ni), cobalt (Co), and aluminum (Al).

The intermediate layer 50 is provided between the second electrode 40 and the first insulating section 31. The intermediate layer 50 is in contact with the second electrode 40 and the first insulating section 31. The intermediate layer 50 extends in the Y direction. The intermediate layer 50 has good adhesiveness to each of the second electrode 40 and the first insulating section 31.

The adhesive force between the intermediate layer 50 and the second electrode 40 is larger than the adhesive force between the second electrode 40 and the first resistance change layer 20. The adhesive force between the first insulating section 31 and the intermediate layer 50 is larger than the adhesive force between the first insulating section 31 and the second electrode 40 which are in direct contact with each other.

The intermediate layer 50 contains a conductive material. Preferably, the intermediate layer 50 does not contain a metal (e.g., Ag) forming a conductive filament into the first resistance change layer 20. For the intermediate layer 50, for instance, Ti and TiN are used.

In the memory device 110, the two adjacent second electrodes 40 (401) and 40 (402) are placed between the two adjacent first insulating sections 31 (311) and 31 (312). Between the two adjacent second electrodes 40 (401) and 40 (402), a second insulating section 60 is provided.

In the layer provided on the first resistance change layer 20, the configuration of the first insulating section 31, the intermediate layer 50, the second electrode 40, the second insulating section 60, the second electrode 40, and the intermediate layer 50 arranged in this order in the X direction constitutes one unit. This unit is repeated in the X direction.

Figure 2A:
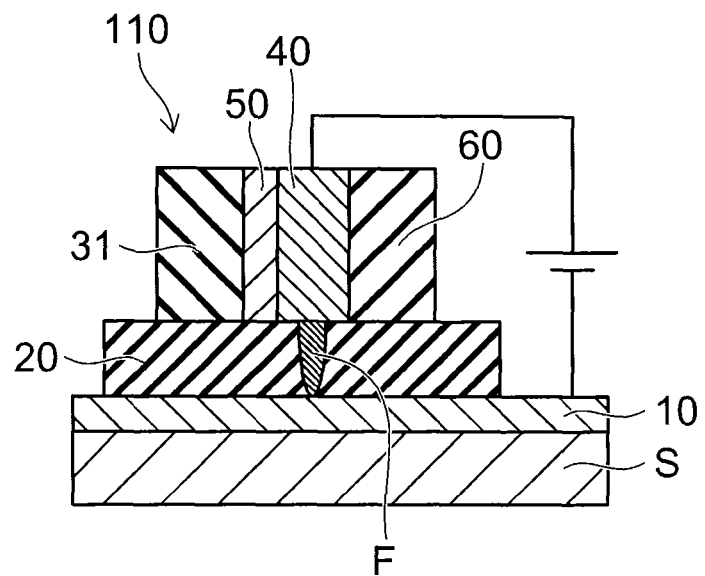
FIGS. 2A and 2B are schematic views illustrating the operation of the memory device.
Figure 2B:
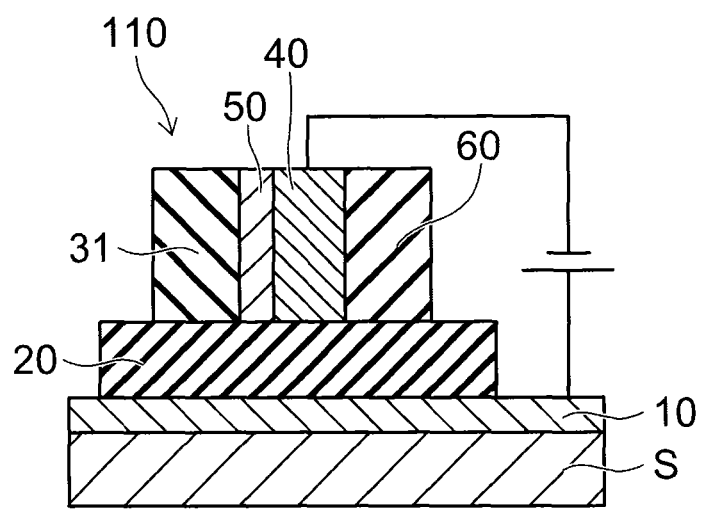

FIGS. 2A and 2B are schematic views illustrating the operation of the memory device.

FIG. 2A shows the low resistance state. FIG. 2B shows the high resistance state. FIGS. 2A and 2B schematically show a memory cell in which a first resistance change layer 20 is provided between one first electrode 10 and one second electrode 40.

In the memory device 110, a prescribed voltage is applied between the first electrode 10 and the second electrode 40 to change the resistance state by formation or elimination of a conductive filament F formed in the first resistance change layer 20.

For instance, as shown in FIG. 2A, upon application of a voltage with the second electrode 40 being positive with respect to the first electrode 10, the metal contained in the second electrode 40 forms a conductive filament F in the first resistance change layer 20. Formation of the conductive filament F decreases the resistance of the memory cell.

Upon application of a voltage with the second electrode 40 being negative with respect to the first electrode 10, the conductive filament F formed in the first resistance change layer 20 is eliminated. Elimination of the conductive filament F increases the resistance of the memory cell.

Formation and elimination of the conductive filament F can be controlled electrically and reversibly. For instance, the state with the conductive filament F formed (low resistance state) can be taken as the ON state, and the state with the conductive filament F eliminated (high resistance state) can be taken as the OFF state. This realizes a nonvolatile memory element.

The second electrode 40 needs to contain a metal for forming a conductive filament F in the first resistance change layer 20. The second electrode 40 functions as an ion source of the CBRAM. In this embodiment, the second electrode 40 contains e.g. Ag. The voltage applied to the second electrode 40 controls formation or elimination of the conductive filament F containing Ag.

In the memory device 110 using formation or elimination of such a conductive filament F, the second electrode 40 needs to be in contact with the first resistance change layer 20. Thus, reliable contact between the second electrode 40 and the first resistance change layer 20 is an important factor in improving the reliability of the memory device 110.

For instance, low adhesiveness between the first resistance change layer 20 constituting the CBRAM and the second electrode 40 being an ion source electrode may cause peeling at the interface between the first resistance change layer 20 and the second electrode 40 during the manufacturing process.

In the memory device 110 according to this embodiment, the first insulating section 31 and the second electrode 40 are connected via the intermediate layer 50. Thus, compared with the case where the first insulating section 31 and the second electrode 40 are in direct contact with each other, the contact state between the second electrode 40 and the first resistance change layer 20 is reliably maintained. This suppresses peeling at the aforementioned interface during the manufacturing process, and improves the reliability of the memory device 110.

Next, a method for manufacturing the memory device 110 according to this embodiment is described.

Figure 3:
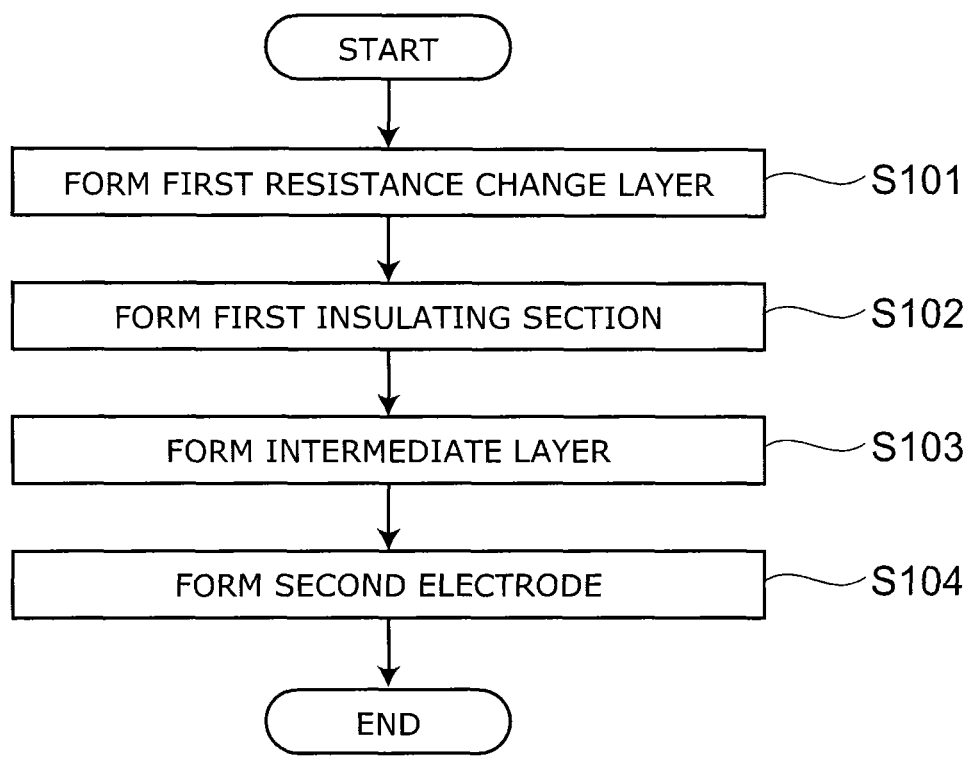
FIG. 3 is a flow chart illustrating the method for manufacturing a memory device.

FIG. 3 is a flow chart illustrating the method for manufacturing a memory device.

As shown in FIG. 3, the method for manufacturing the memory device 110 includes forming a first resistance change layer 20 (step S101), forming a first insulating section 31 (step S102), forming an intermediate layer 50 (step S103), and forming a second electrode 40 (step S104).

Next, a specific method for manufacturing the memory device 110 is described.

FIGS. 4A to 11B are schematic views illustrating the method for manufacturing a memory device.

In FIGS. 4A to 11B, the figure labeled A shows a schematic plan view, and the figure labeled B shows a schematic sectional view taken along line A-A' shown in the figure labeled A.

Figure 4A:
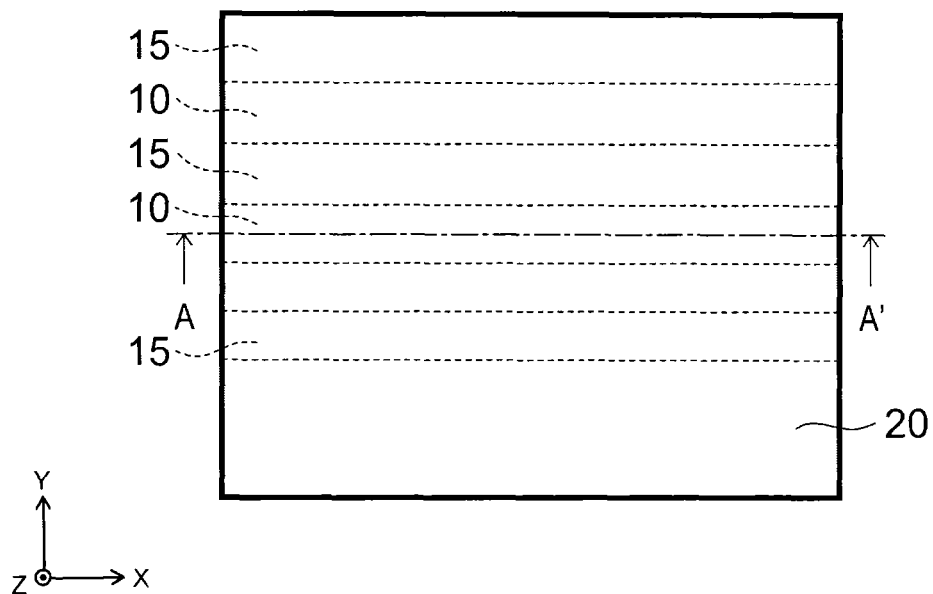
FIGS. 4A to 11B are schematic views illustrating the method for manufacturing a memory device.
Figure 4B:
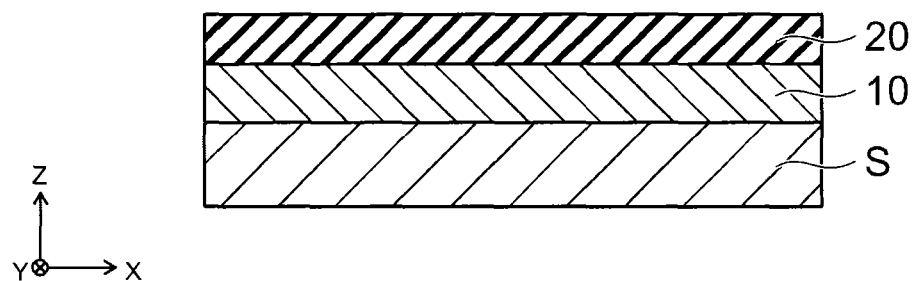

First, as shown in FIGS. 4A and 4B, on a plurality of first electrodes 10 separated by an insulating film 15, a first resistance change layer 20 is formed. For the first electrode 10, for instance, TiN is used.

For the first resistance change layer 20, for instance, amorphous silicon is used. The thickness (thickness in the Z direction) of the first resistance change layer 20 is e.g. 2 nanometers (nm) or more and 50 nm or less. In this embodiment, the thickness of the first resistance change layer 20 is approximately 10 nm. In the case where amorphous silicon is used for the first resistance change layer 20, the amorphous silicon is formed by e.g. the CVD (chemical vapor deposition) method.

The first resistance change layer 20 may be made of other than amorphous silicon. For instance, it may be made of a silicon-containing ion conductive material such as hydrogenated amorphous silicon (a-Si:H), polycrystalline silicon (poly-Si), silicon oxide ($SiO_2$), silicon oxynitride (SiON), silicon nitride (SiN), silicon carbide (SiC), and carbon-doped silicon oxide (SiOC). It is also possible to use a structure in which these films are doped with at least one of sulfur (S), chlorine (Cl), fluorine (F), iodine (I), oxygen (O), and nitrogen (N). Other ion conductive materials can include silver oxide ($Ag_2O$), silver sulfide ($Ag_2S$), silver selenide ($Ag_2Se$), silver telluride ($Ag_2Te$), silver iodide (AgI), copper iodide ($Cu_2I$), copper oxide (CuO), copper sulfide (CuS), copper selenide (CuSe), copper telluride (CuTe), and germanium oxide ($GeO_2$). Furthermore, the first resistance change layer 20 may have a structure in which these materials are combined and stacked in a plurality of layers. These materials can be used without being limited to the specific composition ratio described herein.

Figure 5A:
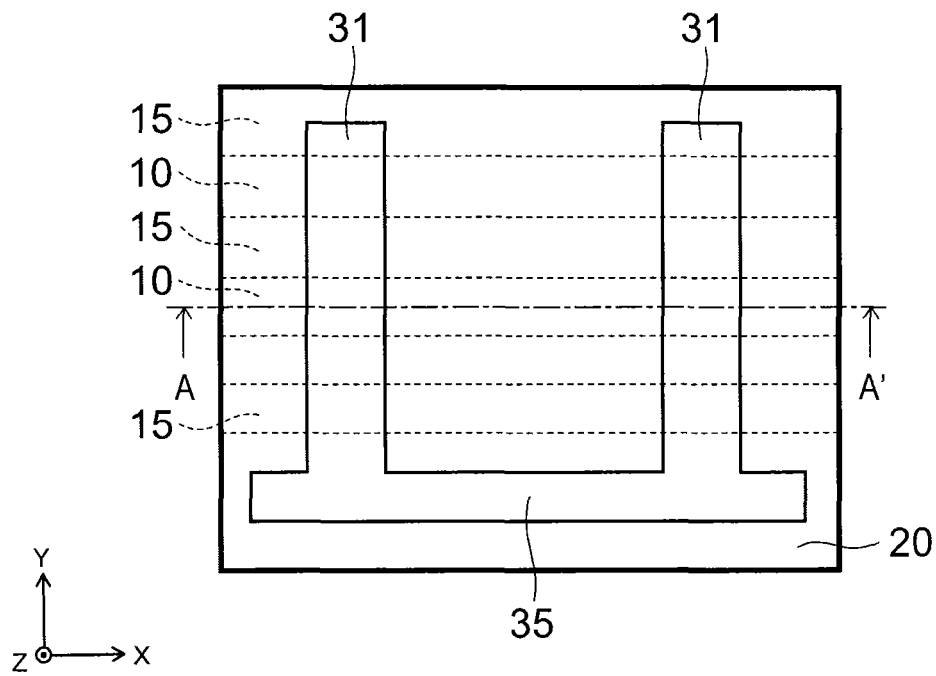
Figure 5B:
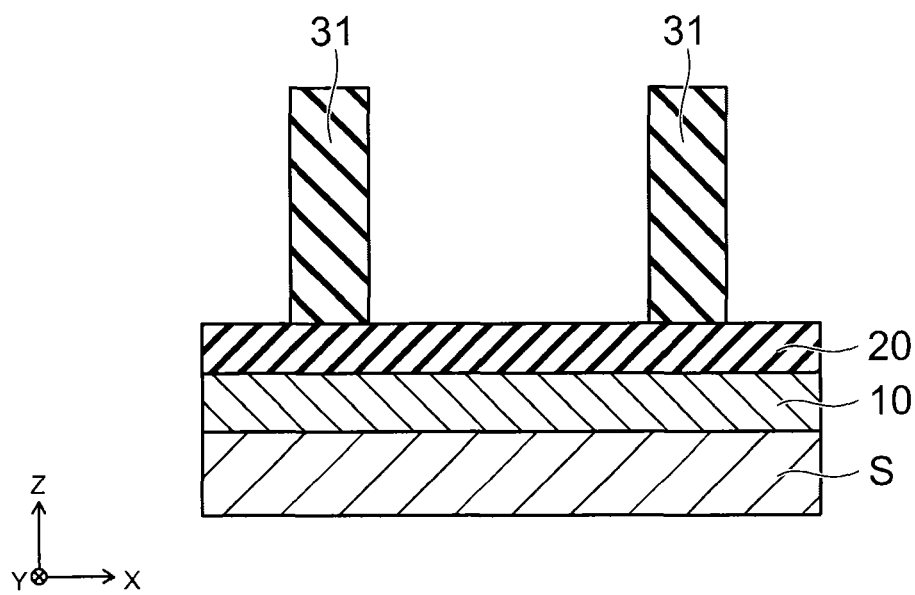

Next, as shown in FIGS. 5A and 5B, a first insulating section 31 is formed on the first resistance change layer 20. The first insulating section 31 is formed by e.g. depositing silicon nitride (SiN) on the first resistance change layer 20 and then patterning it. In the case of forming a plurality of first insulating sections 31, the first insulating sections 31 are linked at one end by a linking section 35. The height (height in the Z direction) of the first insulating section 31 is e.g. 100 nm.

Figure 6A:
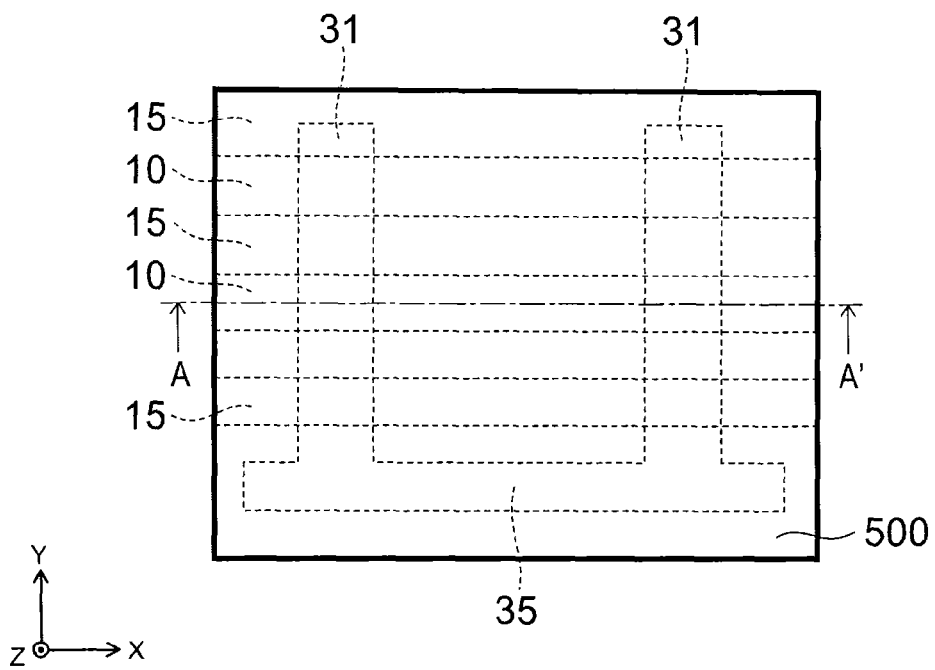
Figure 6B:
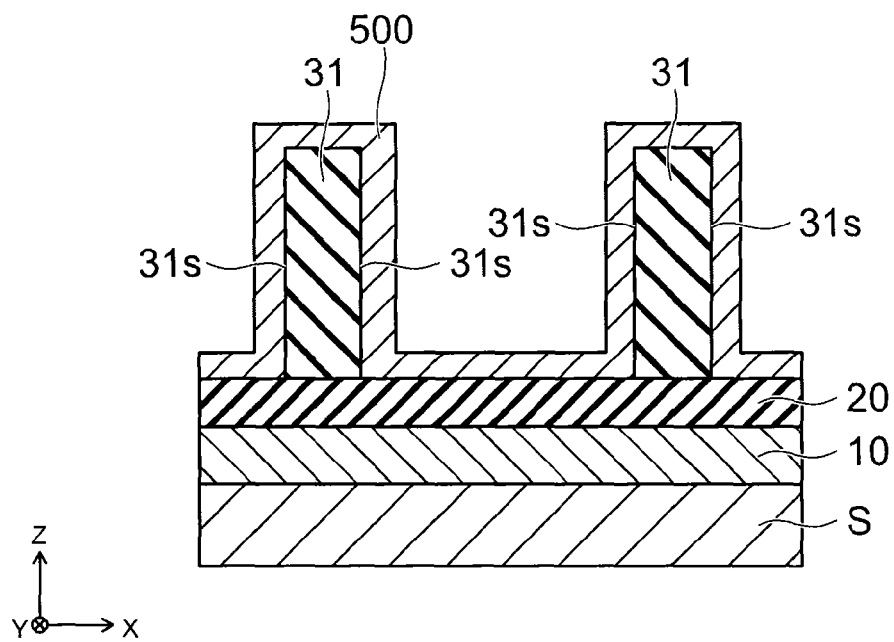

Next, as shown in FIGS. 6A and 6B, an intermediate layer material film 500 is deposited by e.g. the CVD method. For the intermediate layer material film 500, for instance, TiN is used. The intermediate layer material film 500 is formed on the surface of the first insulating section 31 and the surface of the first resistance change layer 20.

The deposition thickness of the intermediate layer material film 500 is e.g. 3 nm. The thickness of the intermediate layer material film 500 formed on the side surface 31s of the first insulating section 31 (thickness in the direction normal to the side surface 31s) is approximately 3 nm. If the thickness of the intermediate layer material film 500 is too thick, the occupied area of the structure of the memory element (e.g., the structural body of the intermediate layer 50, the second electrode 40, the first resistance change layer 20, and the first electrode 10) in the entire element is made large. This hampers high integration of the memory device 110. If the thickness of the intermediate layer material film 500 is too thin, formation of the intermediate layer 50 is made difficult. Thus, preferably, the thickness of the intermediate layer material film 500 is approximately 0.5 nm or more and 5 nm or less.

For the intermediate layer material film 500, Ti and TiN may also be used. For instance, the intermediate layer material film 500 may have a stacked structure in which Ti and TiN are stacked in this order. The film thickness of Ti and TiN is approximately 1 nm each.

Figure 7A:
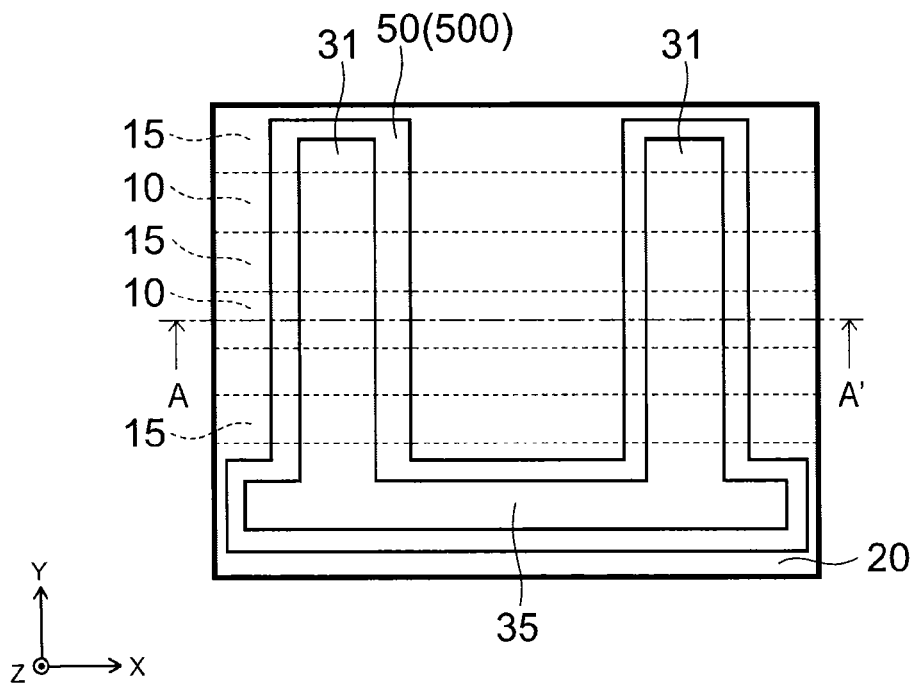
Figure 7B:
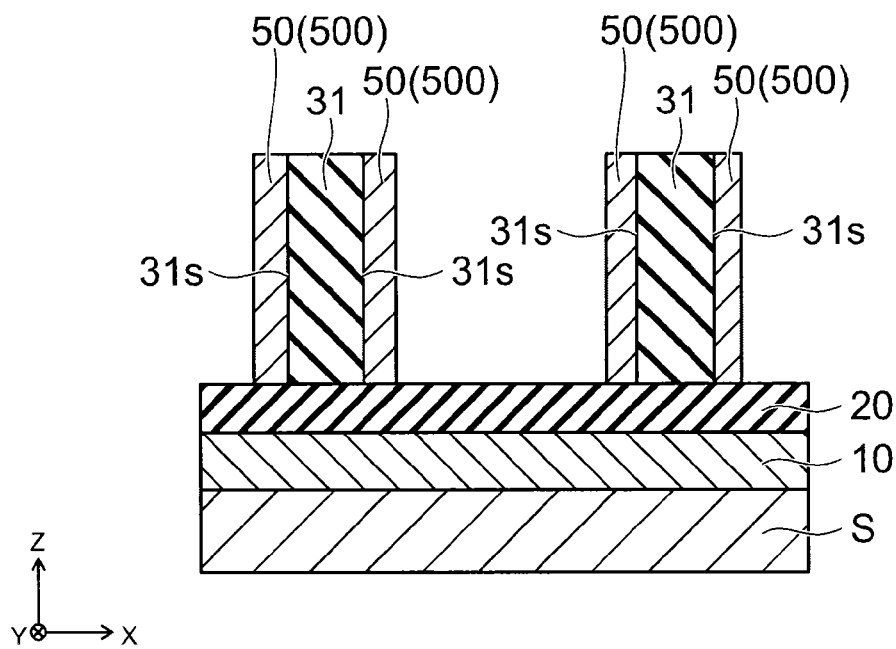

Next, as shown in FIGS. 7A and 7B, anisotropic etching is performed on the intermediate layer material film 500 by e.g. reactive ion etching (RIE). The anisotropic etching proceeds in the Z direction. Thus, the intermediate layer material film 500 is left only on the side surface 31s of the first insulating section 31. The remaining intermediate layer material film 500 constitutes an intermediate layer 50.

Figure 8A:
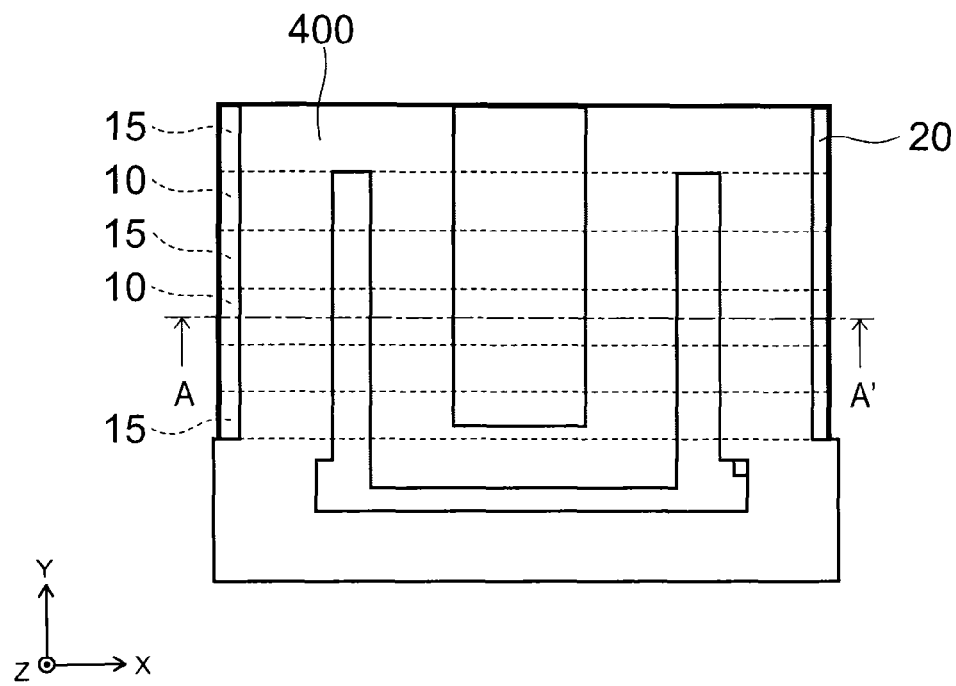
Figure 8B:
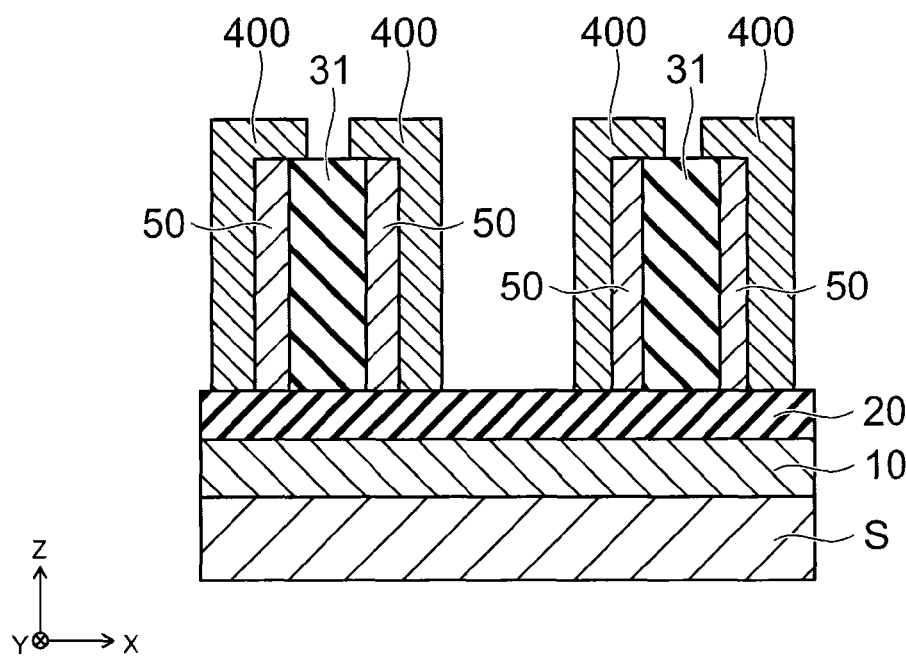

Next, as shown in FIGS. 8A and 8B, a second electrode material film 400 is formed. In this embodiment, Ag is used for the second electrode material film 400. Ag of the second electrode material film 400 is precipitated by e.g. the electroplating method.

More specifically, a plating bath containing Ag is prepared. The substrate S with the intermediate layer 50 formed thereon is immersed in this plating bath. Thus, using the intermediate layer 50 as a primer, Ag is precipitated on the intermediate layer 50. Here, among the layers exposed at the surface, only the intermediate layer 50 is conductive, and the other layers are not conductive. Thus, the precipitation reaction of Ag does not proceed on the portion other than the intermediate layer 50. The precipitation reaction of Ag selectively proceeds on the intermediate layer 50 alone.

Furthermore, the plurality of first insulating sections 31 are linked by the linking section 35. Thus, on the substrate S, the intermediate layer 50 is united into one. This prevents precipitation failure of Ag due to discontinuity of the intermediate layer 50.

Ag constituting the second electrode material film 400 is isotropically precipitated on the intermediate layer 50. The amount of precipitation of the second electrode material film 400 by the electroplating method is controlled by time.

Figure 9A:
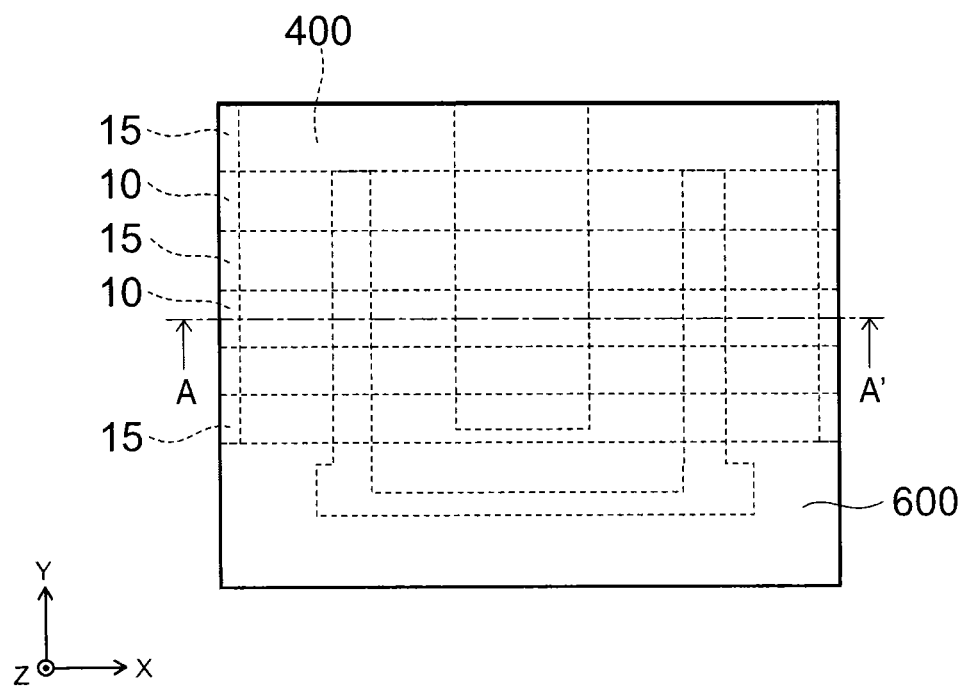
Figure 9B:
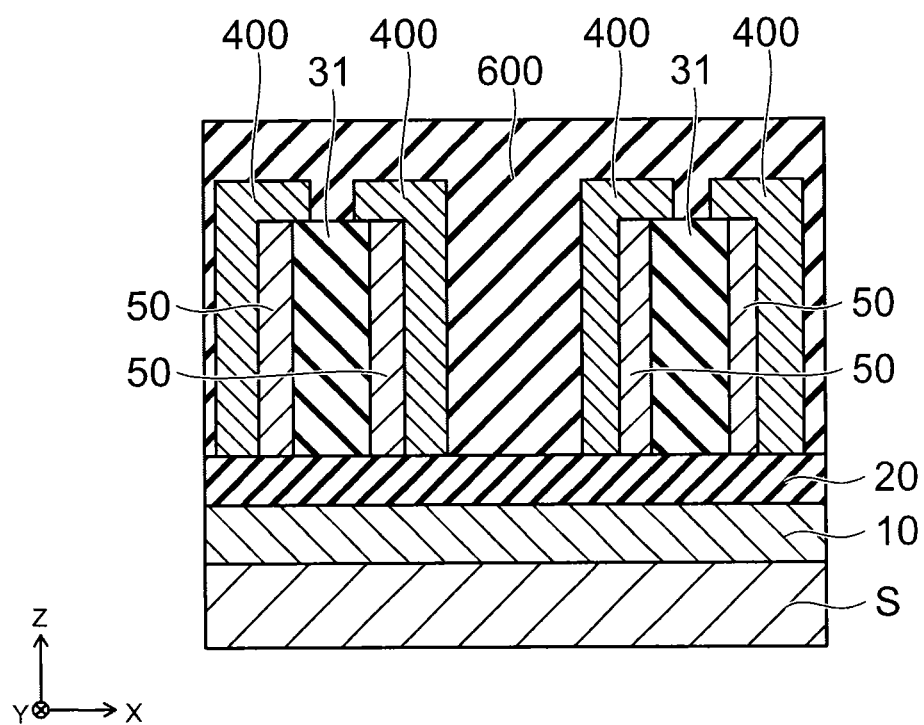

Next, as shown in FIGS. 9A and 9B, a second insulating section material film 600 is formed. The second insulating section material film 600 is embedded in the portion where the second electrode material film 400 is not precipitated. For the second insulating section material film 600, for instance, silicon oxide ($SiO_2$) is used.

Figure 10A:
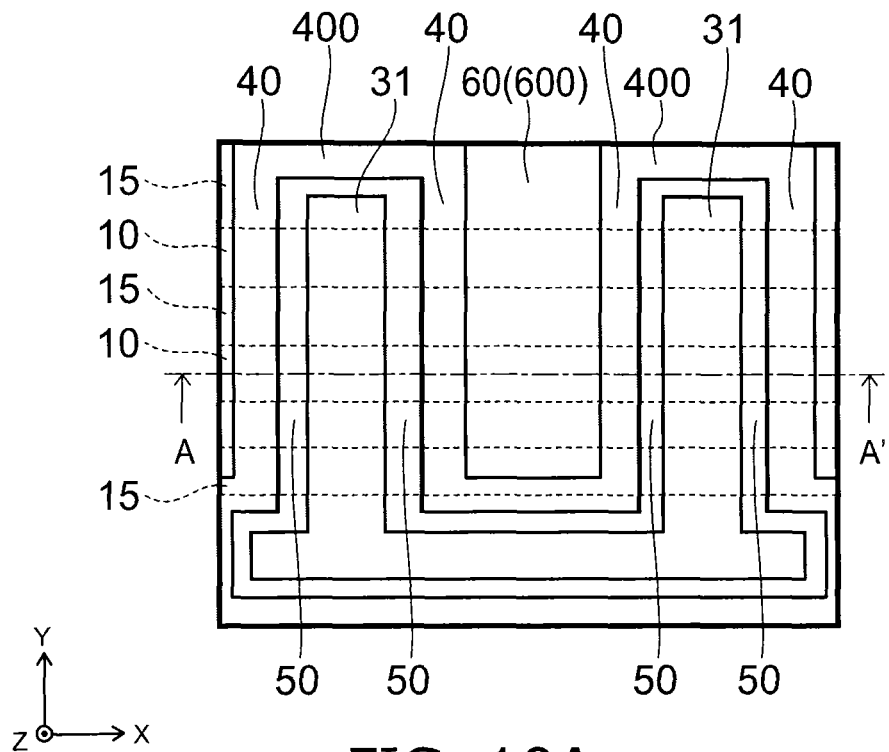
Figure 10B:
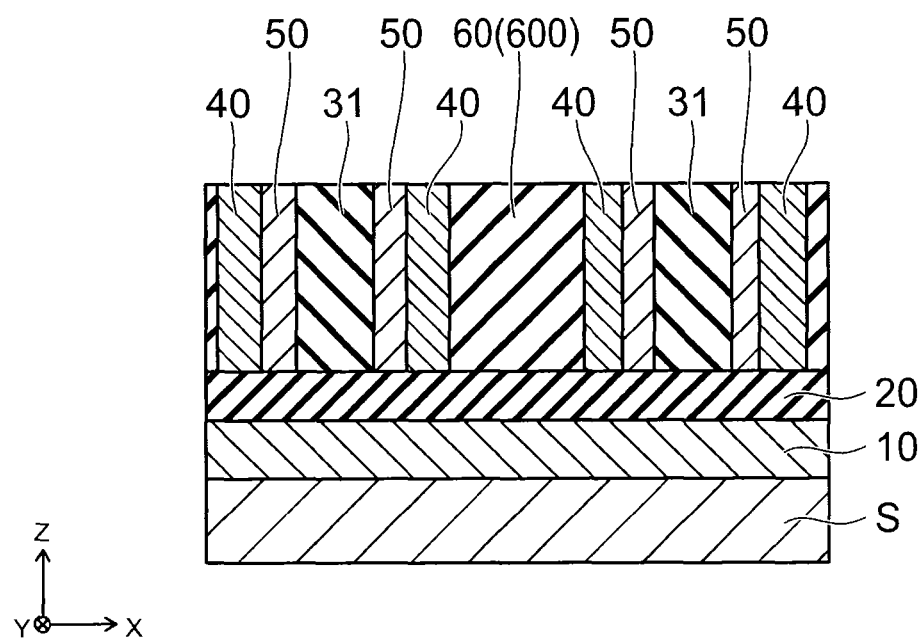

Next, as shown in FIGS. 10A and 10B, the upper surface of the second insulating section material film 600 is planarized by e.g. the CMP (chemical mechanical polishing) method. The planarization of the second insulating section material film 600 is performed until the first insulating section 31 and the intermediate layer 50 are exposed.

The second insulating section material film 600 embedded between two adjacent second electrodes 40 (401) and 40 (402) constitutes a second insulating section 60. The height (height in the Z direction) of the first insulating section 31, the intermediate layer 50, the second electrode 40, and the second insulating section 60 is e.g. 10 nm or more and 100 nm or less. The height (height in the Z direction) of the second electrode 40 being higher is preferable because the electrical resistance is made lower. However, if the height is too high, then the aspect ratio is increased and decreases the processability. Thus, preferably, the height of the second electrode 40 is approximately 10 nm or more and 100 nm or less.

Here, when the planarization by CMP is performed, unless the intermediate layer 50 is provided, the second electrode 40 may be peeled at the interface between the first resistance change layer 20 and the second electrode 40. This results from low adhesiveness between the second electrode 40 and the first resistance change layer 20. As a means for solving this, it may be considered to insert a layer having a bonding function between the second electrode 40 and the first resistance change layer 20.

However, in order to form a conductive filament F in the first resistance change layer 20, the second electrode 40 needs to be in contact with the first resistance change layer 20. Thus, a layer having a bonding function cannot be provided between the second electrode 40 and the first resistance change layer 20.

In this embodiment, the second electrode 40 is formed on the first insulating section 31 via the intermediate layer 50.

Thus, even if planarization by CMP is performed, the second electrode 40 is not peeled from the first resistance change layer 20.

Figure 11A:
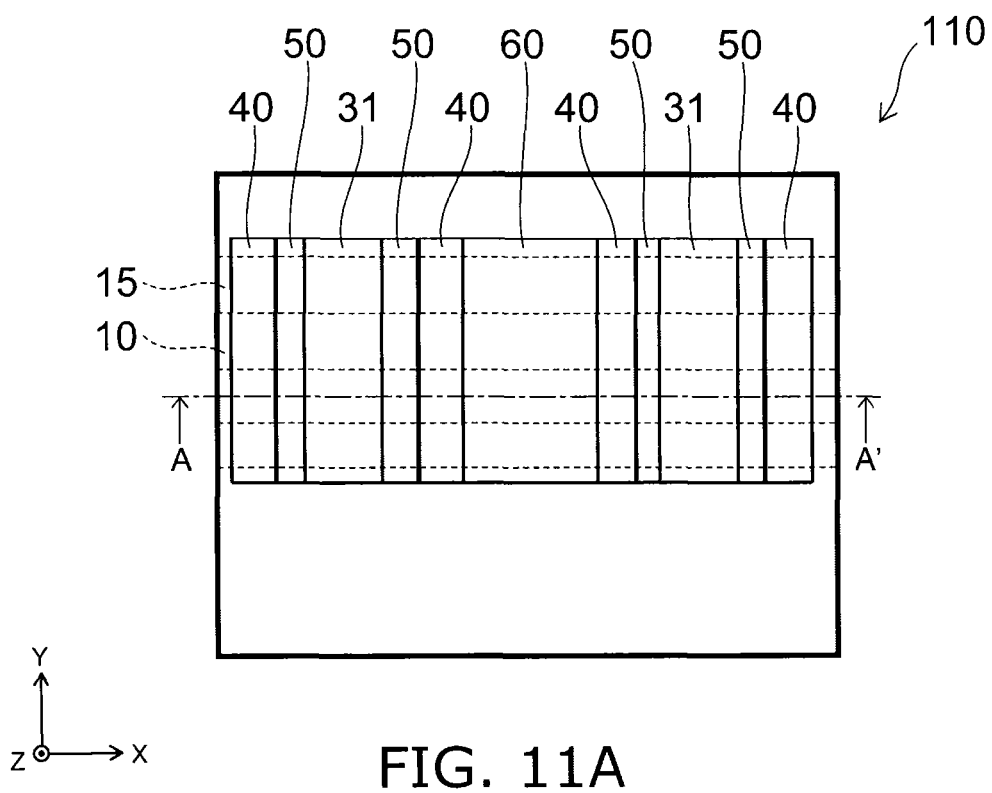
Figure 11B:
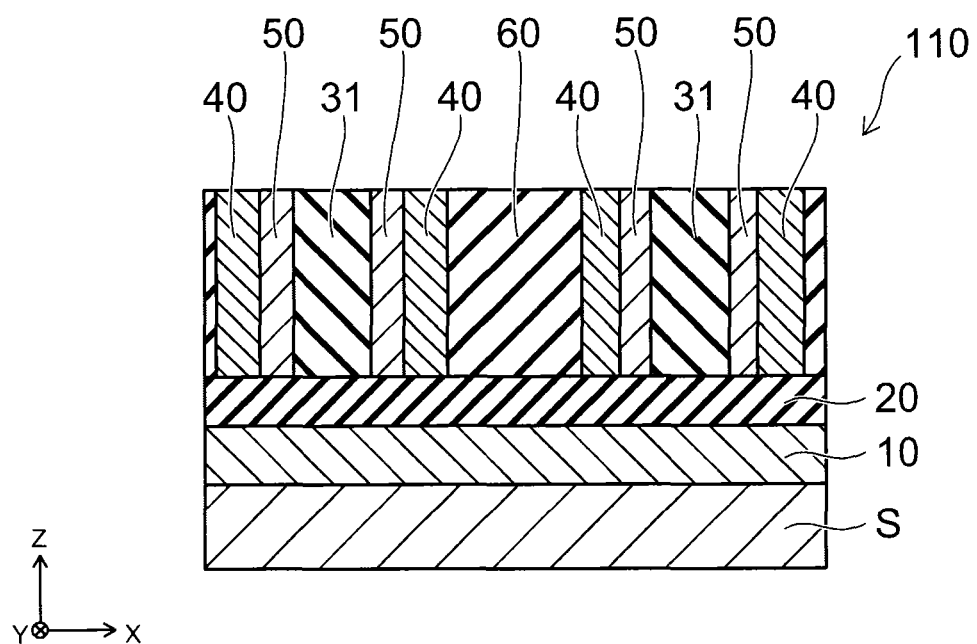

Next, as shown in FIGS. 11A and 11B, trimming of electrodes and the like is performed. In this trimming, the unnecessary portion on the substrate S is removed. By this trimming, the linking section 35 is removed. Thus, the memory device 110 is completed.

Figure 12A:
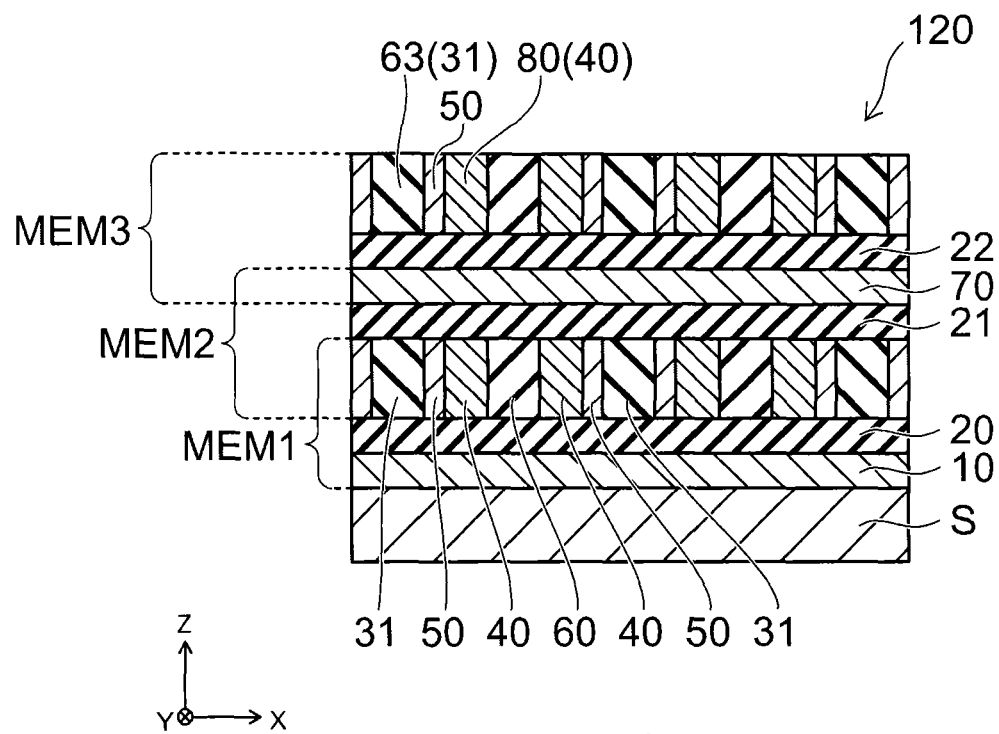
FIGS. 12A and 12B are schematic sectional views illustrating a memory device according to a second embodiment.
Figure 12B:
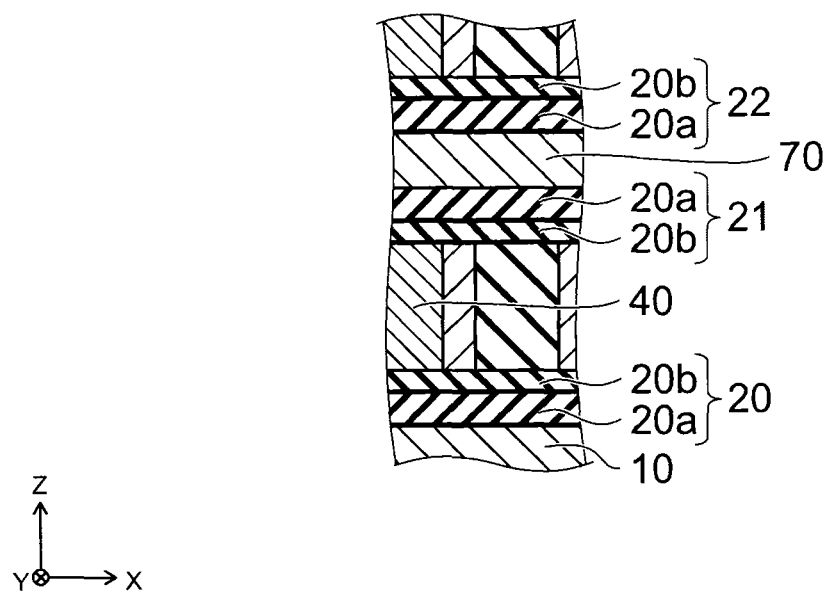

FIGS. 12A and 12B are schematic sectional views illustrating a memory device according to a second embodiment.

FIG. 12A shows a schematic sectional view of the memory device 120 according to the second embodiment. FIG. 12B shows a schematic sectional view of the memory device 120 being partly enlarged.

As shown in FIG. 12A, the memory device 120 has a stacked cross-point structure. In addition to the configuration of the memory device 110, the memory device 120 further includes a second resistance change layer 21 and a third electrode 70.

The second resistance change layer 21 is provided on the second electrode 40. The second resistance change layer 21 is in contact with the second electrode 40. The third electrode 70 is provided on the second resistance change layer 21. The third electrode 70 extends in the X direction. For instance, the third electrode 70 is provided in a plurality. The plurality of third electrodes 70 are spaced in the Y direction.

The memory device 120 includes a first memory layer MEM1 and a second memory layer MEM2. The first memory layer MEM1 includes a first electrode 10, a first resistance change layer 20, and a second electrode 40. The second memory layer MEM2 includes a third electrode 70, a second resistance change layer 21, and the second electrode 40.

In the first memory layer MEM1 and the second memory layer MEM2, the second electrode 40 is shared. The first memory layer MEM1 has a layer structure vertically inverted from the layer structure of the second memory layer MEM2.

The memory device 120 further includes a third resistance change layer 22, a fourth electrode 80, a third insulating section 63, and an intermediate layer 50. The third resistance change layer 22 is provided on the third electrode 70. The fourth electrode 80 is provided on the third resistance change layer 22. The fourth electrode 80 is in contact with the third resistance change layer 22. The third insulating section 63 is provided on the third resistance change layer 22. The intermediate layer 50 is provided between the fourth electrode 80 and the third insulating section 63. The intermediate layer 50 is in contact with the fourth electrode 80 and the third insulating section 63.

The fourth electrode 80, the third insulating section 63, and the intermediate layer 50 extend in the Y direction. For instance, the fourth electrode 80 is provided in a plurality. The plurality of fourth electrodes 80 are spaced in the X direction. For instance, the third insulating section 63 is provided in a plurality. The plurality of third insulating sections 63 are spaced in the X direction. For instance, the intermediate layer 50 is provided in a plurality. The plurality of intermediate layers 50 are spaced in the X direction.

The memory device 120 further includes a third memory layer MEM3. The third memory layer MEM3 includes the third electrode 70, the third resistance change layer 22, and the fourth electrode 80. In the second memory layer MEM2 and the third memory layer MEM3, the third electrode 70 is shared.

The third memory layer MEM3 has a layer structure vertically inverted from the layer structure of the second memory layer MEM2. That is, the layer structure of the third memory layer MEM3 is equal to the layer structure of the first memory layer MEM1. The third electrode 70 corresponds to the first electrode 10. The third resistance change layer 22 corresponds to the first resistance change layer 20. The fourth electrode 80 corresponds to the second electrode 40.

In the case of stacking a plurality of memory layers, vertically inverted layer structures with some of the electrodes shared are sequentially stacked.

The first resistance change layer 20, the second resistance change layer 21, and the third resistance change layer 22 may have a configuration in which a plurality of layers are stacked. For instance, as shown in FIG. 12B, the first resistance change layer 20, the second resistance change layer 21, and the third resistance change layer 22 each include a first layer 20a and a second layer 20b. The first layer 20a contains e.g. amorphous silicon. The second layer 20b contains e.g. $SiO_2$.

The order of the stacked structure in the first resistance change layer 20 is opposite to the order of the stacked structure in the second resistance change layer 21. The order of the stacked structure in the second resistance change layer 21 is opposite to the order of the stacked structure in the third resistance change layer 22. That is, in the adjacent memory layers, the order of the stacked structure of the resistance change layers is opposite to each other.

The example of the memory device 120 shown in FIGS. 12A and 12B has illustrated the configuration in which three memory layers MEM1-MEM3 are stacked. However, in this configuration, more memory layers may be stacked. In the memory device 120, some of the electrodes are shared in the configuration in which a plurality of memory layers are stacked. Thus, a memory device with low cost and high capacity is realized.

Third Embodiment

Next, a memory device according to a third embodiment is described.

Figure 13A:
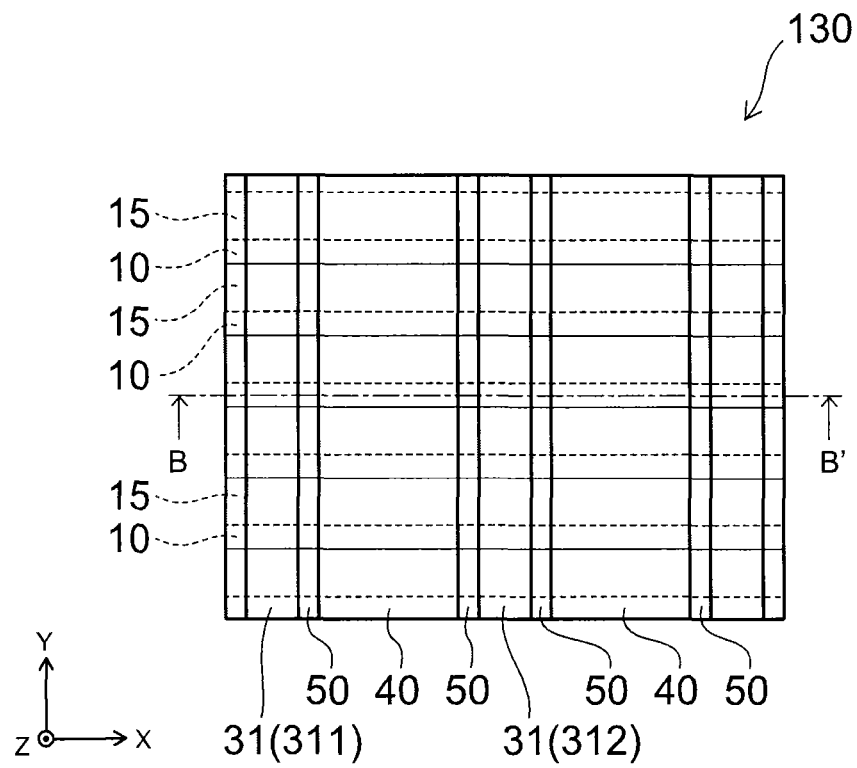
FIGS. 13A and 13B are schematic views illustrating the memory device according to the third embodiment.
Figure 13B:
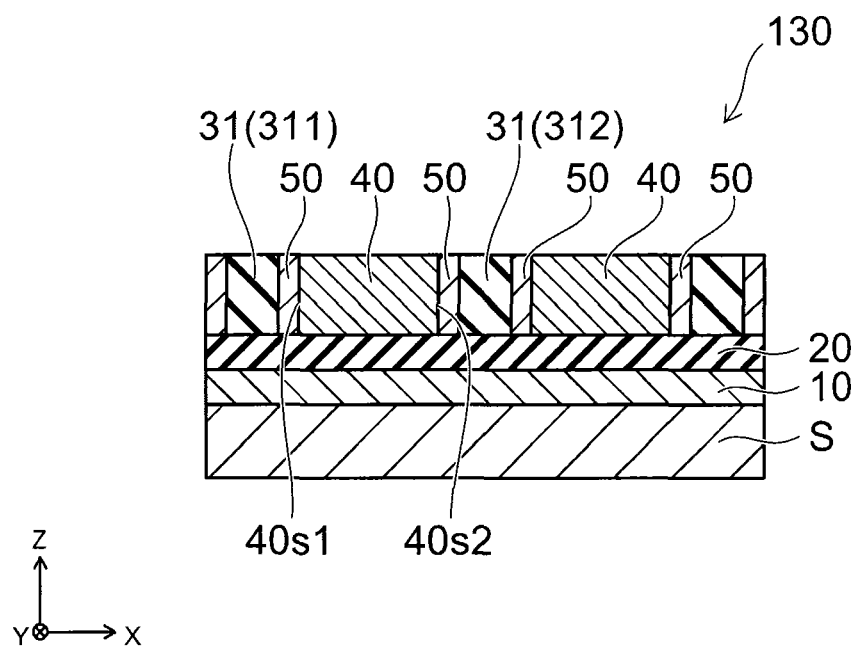

FIGS. 13A and 13B are schematic views illustrating the memory device according to the third embodiment.

FIG. 13A shows a schematic plan view of the memory device 130 according to the third embodiment. FIG. 13B shows a schematic sectional view taken along line A-A' shown in FIG. 13A.

As shown in FIGS. 13A and 13B, in the memory device 130, a second electrode 40 is placed between two adjacent first insulating sections 31 (311) and 31 (312). An intermediate layer 50 is provided between the second electrode 40 and the first insulating section 31 (311). An intermediate layer 50 is provided between the second electrode 40 and the first insulating section 31 (312).

In the memory device 130, one side surface 40s1 of the second electrode 40 is in contact with the intermediate layer 50 being in contact with the first insulating section 31 (311). The other side surface 40s2 of the second electrode 40 is in contact with the intermediate layer 50 being in contact with the first insulating section 31 (312). The second electrode 40 is connected to the first insulating sections 31 (311) and 31 (312) via the intermediate layers 50 at both side surfaces 40s1 and 40s2 in the X direction. Thus, in the memory device 130, the adhesive force of the second electrode 40 is made higher than in the memory device 110.

Next, a method for manufacturing the memory device 130 is described.

Figure 14A:
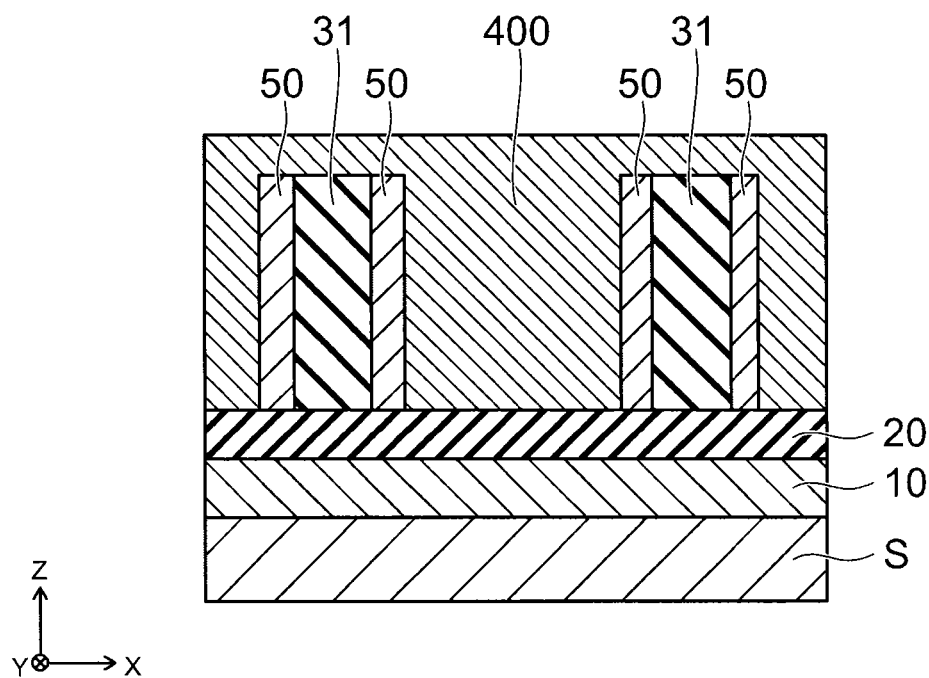
FIGS. 14A and 14B are schematic sectional views illustrating the method for manufacturing a memory device according to the third embodiment.
Figure 14B:
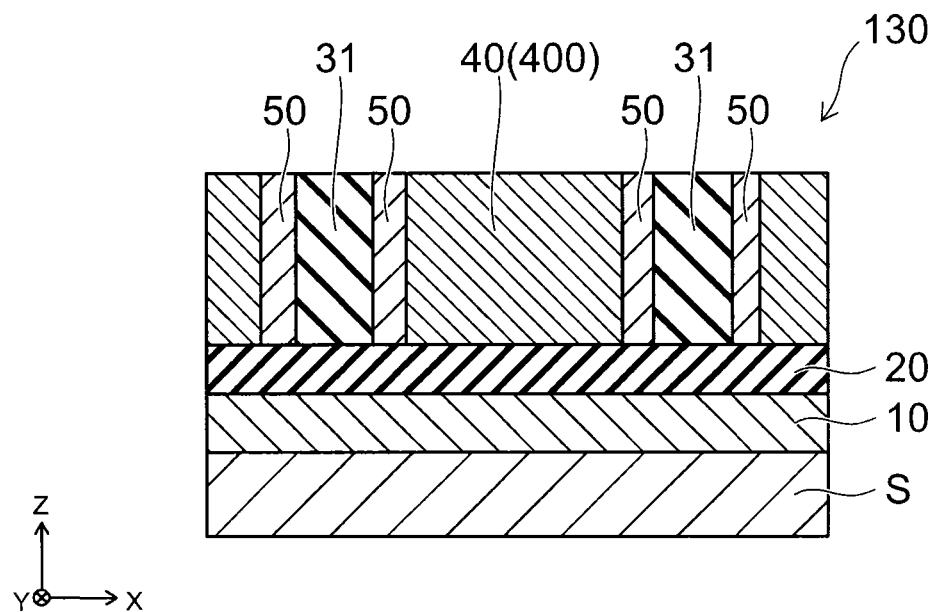

FIGS. 14A and 14B are schematic sectional views illustrating the method for manufacturing a memory device according to the third embodiment.

Here, part of the method for manufacturing the memory device 110 shown in FIGS. 4A to 7B is in common with part of the method for manufacturing the memory device 130.

Next, as shown in FIG. 14A, a second electrode material film 400 is formed. In this embodiment, Ag is used for the second electrode material film 400. Ag of the second electrode material film 400 is precipitated by e.g. the electroplating method. In this embodiment, the time for the electroplating method is controlled to embed the second electrode material film 400 between two opposed intermediate layers 50.

Next, as shown in FIG. 14B, the upper surface of the second electrode material film 400 is planarized by e.g. the CMP method. Then, similarly to the method for manufacturing the memory device 110 shown in FIGS. 11A and 11B, trimming of electrodes and the like is performed. Thus, the memory device 130 is completed.

By embedding the second electrode 40 between two adjacent first insulating sections 31 (311) and 31 (312), the width (width in the X direction) of the second electrode 40 is stabilized. Thus, a memory device 130 with high reliability is realized.

Fourth Embodiment

Next, a memory device according to a fourth embodiment is described.

Figure 15:
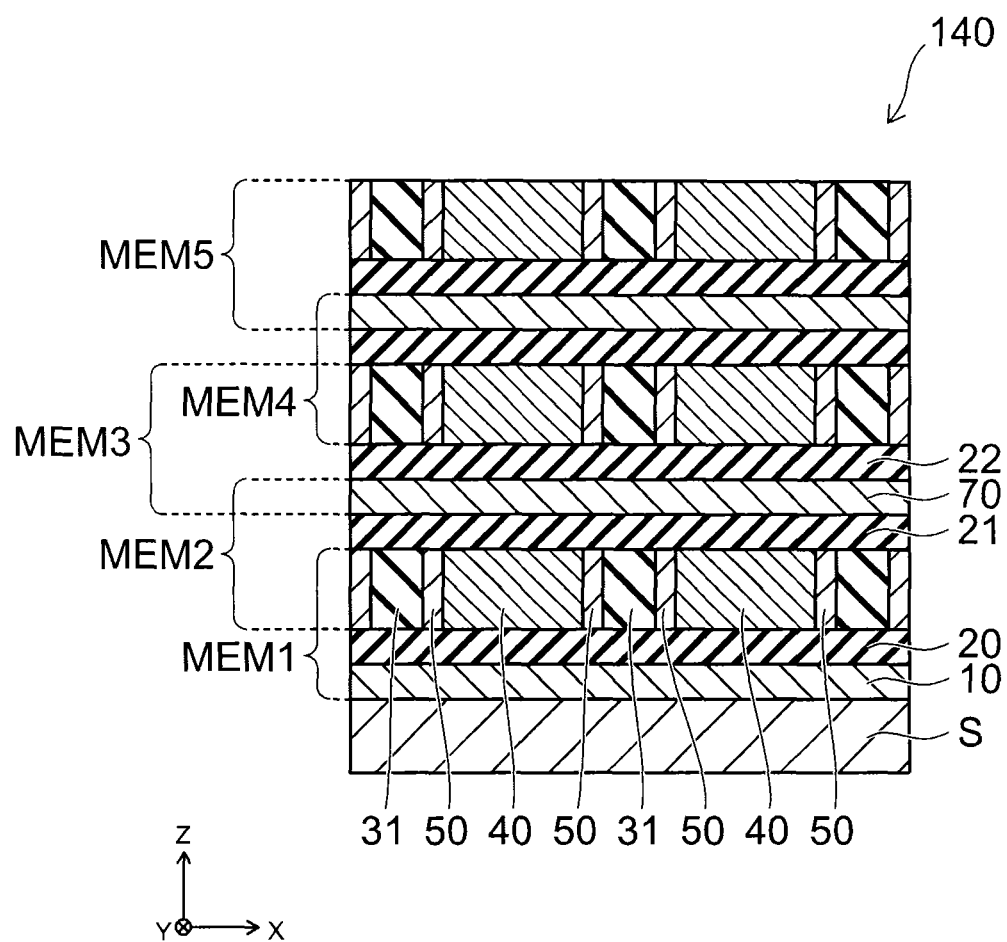
FIG. 15 is a schematic sectional view illustrating the memory device according to the fourth embodiment.

FIG. 15 is a schematic sectional view illustrating the memory device according to the fourth embodiment.

As shown in FIG. 15, the memory device 140 according to the fourth embodiment has a stacked cross-point structure. The memory device 140 has a structure in which the memory layer included in the memory device 130 is stacked in a plurality of layers.

The memory device 140 includes first to fifth memory layers MEM1-MEM5. In the first to fifth memory layers MEM1-MEM5, the layer structures of two adjacent memory layers are vertically inverted with respect to each other. In two adjacent memory layers, some of the electrodes are shared.

For instance, the first memory layer MEM1 has a layer structure in which a first electrode 10, a first resistance change layer 20, and a second electrode 40 are stacked in this order upward in the Z direction. The second memory layer MEM2 has a layer structure in which the second electrode 40, a second resistance change layer 21, and a third electrode 70 are stacked in this order upward in the Z direction. Here, the first electrode 10 corresponds to the third electrode 70. The first resistance change layer 20 corresponds to the second resistance change layer 21. The second electrode 40 is shared in the first memory layer MEM1 and the second memory layer MEM2.

Similarly, the layer structure of the third memory layer MEM3 is vertically inverted with respect to the layer structure of the second memory layer MEM2. The layer structure of the fourth memory layer MEM4 is vertically inverted with respect to the layer structure of the third memory layer MEM3. The layer structure of the fifth memory layer MEM5 is vertically inverted with respect to the layer structure of the fourth memory layer MEM4.

The memory device 140 has a configuration in which a plurality of memory layers are stacked. In this configuration, some of the electrodes are shared. Thus, a memory device with low cost and high capacity is realized. Furthermore, in each memory layer, the width of the second electrode 40 and the electrode corresponding thereto is stabilized. Thus, a memory device 140 with high reliability is realized.

Fifth Embodiment

Next, a memory device according to a fifth embodiment is described.

Figure 16A:
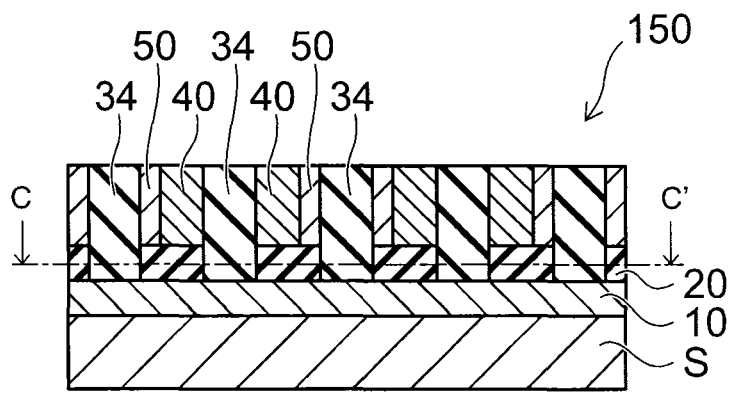
FIGS. 16A and 16B are schematic views illustrating the memory device according to the fifth embodiment.
Figure 16B:
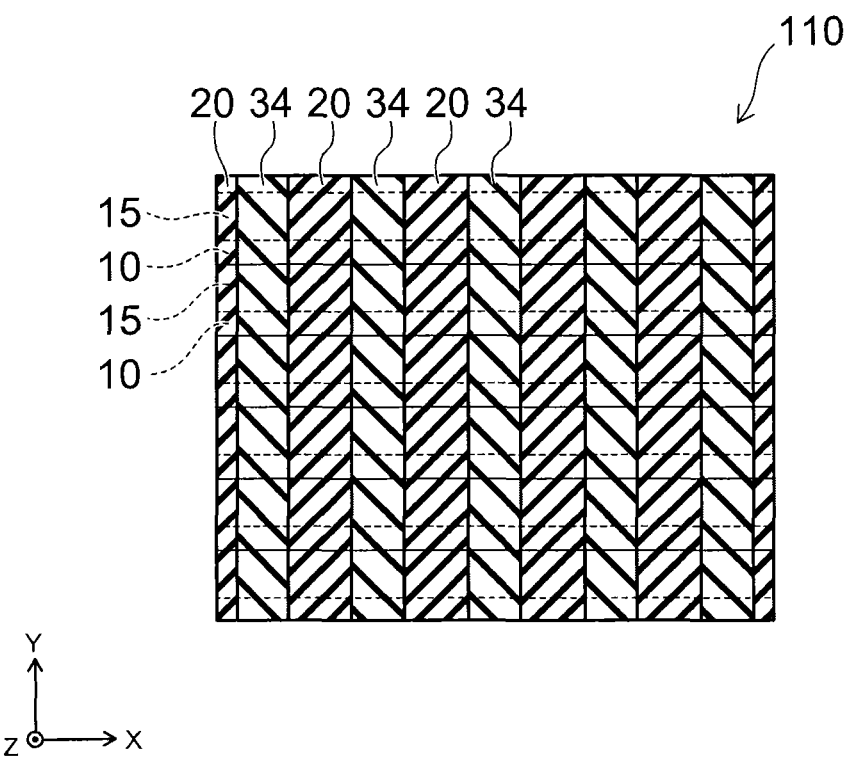

FIGS. 16A and 16B are schematic views illustrating the memory device according to the fifth embodiment.

FIG. 16A shows a schematic sectional view of the memory device 150 according to the fifth embodiment. FIG. 16B shows a schematic sectional view taken along line C-C' shown in FIG. 16A.

As shown in FIGS. 16A and 16B, the memory device 150 includes a first electrode 10, a first resistance change layer 20, a separation insulating section 34, a second electrode 40, and an intermediate layer 50. The separation insulating section 34 is provided on the first electrode 10. The separation insulating section 34 is in contact with the intermediate layer 50. The first resistance change layer 20 is divided by the separation insulating section 34.

The first resistance change layer 20 extends in the Y direction. The first resistance change layer 20 is formed like a stripe. In the memory device 150, the first resistance change layer 20 is divided by the separation insulating section 34. This reduces the interference effect between adjacent memory cells. Thus, the reliability of the memory device 150 is improved.

Next, a method for manufacturing the memory device 150 is described.

FIGS. 17A to 19B are schematic sectional views illustrating the method for manufacturing a memory device according to the fifth embodiment.

Here, part of the method for manufacturing the memory device 110 shown in FIGS. 4A to 8B is in common with part of the method for manufacturing the memory device 150.

Figure 17A:
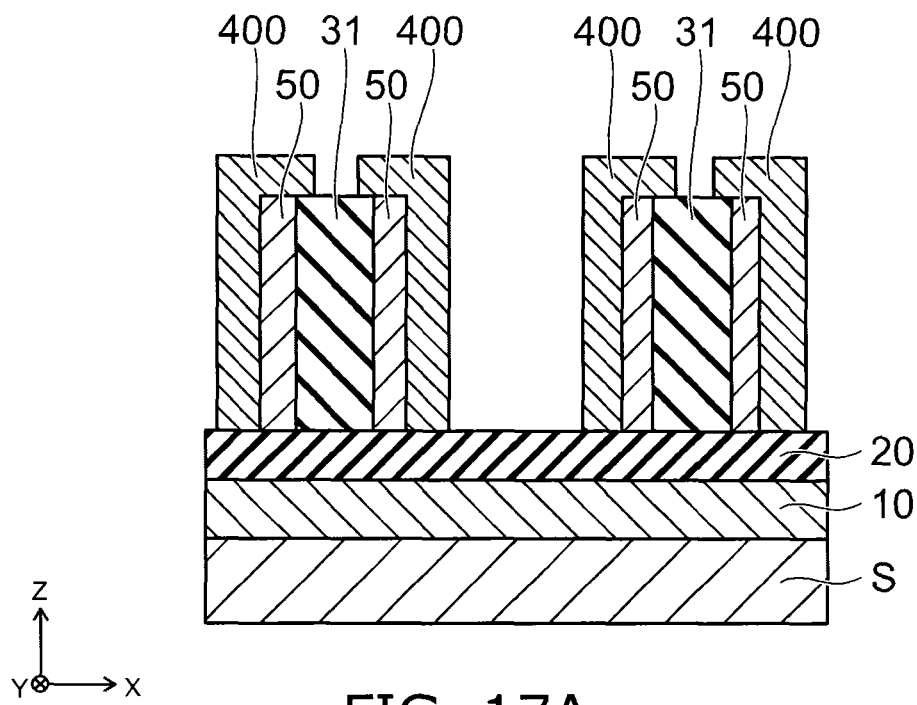
FIGS. 17A to 19B are schematic sectional views illustrating the method for manufacturing a memory device according to the fifth embodiment.
Figure 17B:
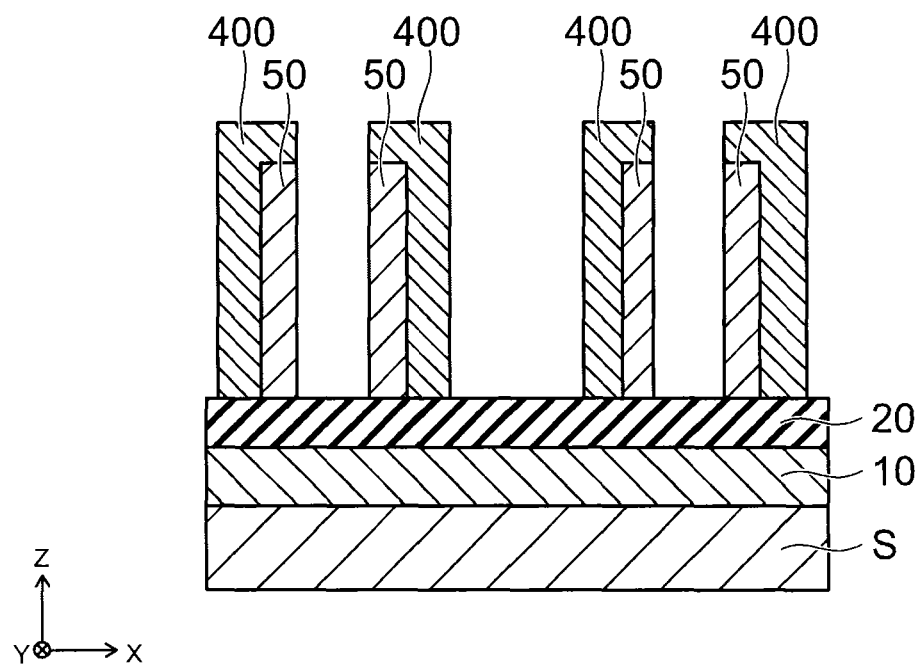

FIG. 17A shows the state in which a second electrode material film 400 is formed. Next, as shown in FIG. 17B, the first insulating section 31 is removed by selective etching.

Figure 18A:
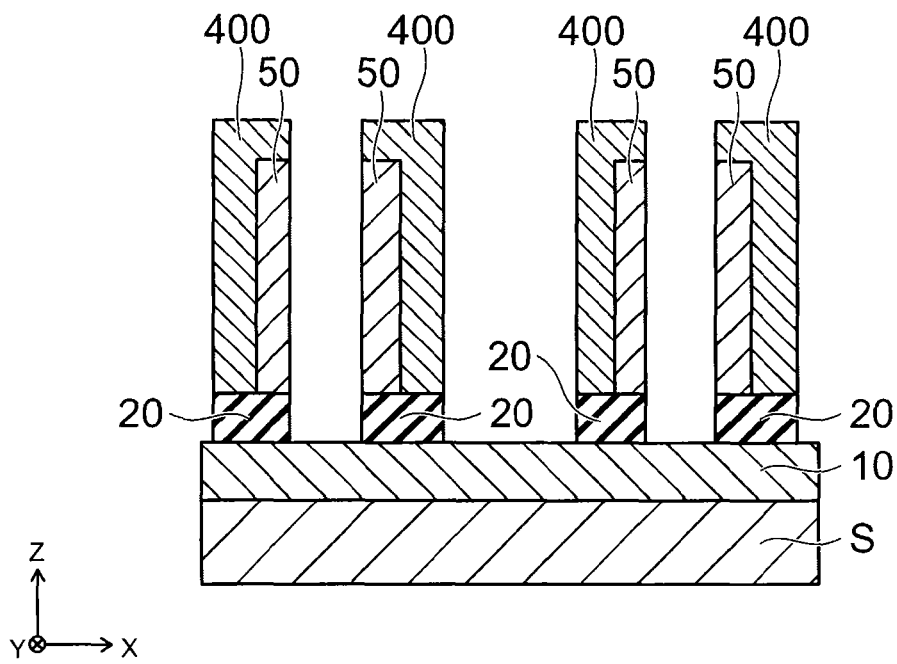

Next, as shown in FIG. 18A, the first resistance change layer 20 is partly etched. The first resistance change layer 20 is partly removed by e.g. RIE. In this etching, the second electrode material film 400 and the intermediate layer 50 are used as a mask. Thus, the first resistance change layer 20 is divided.

Figure 18B:
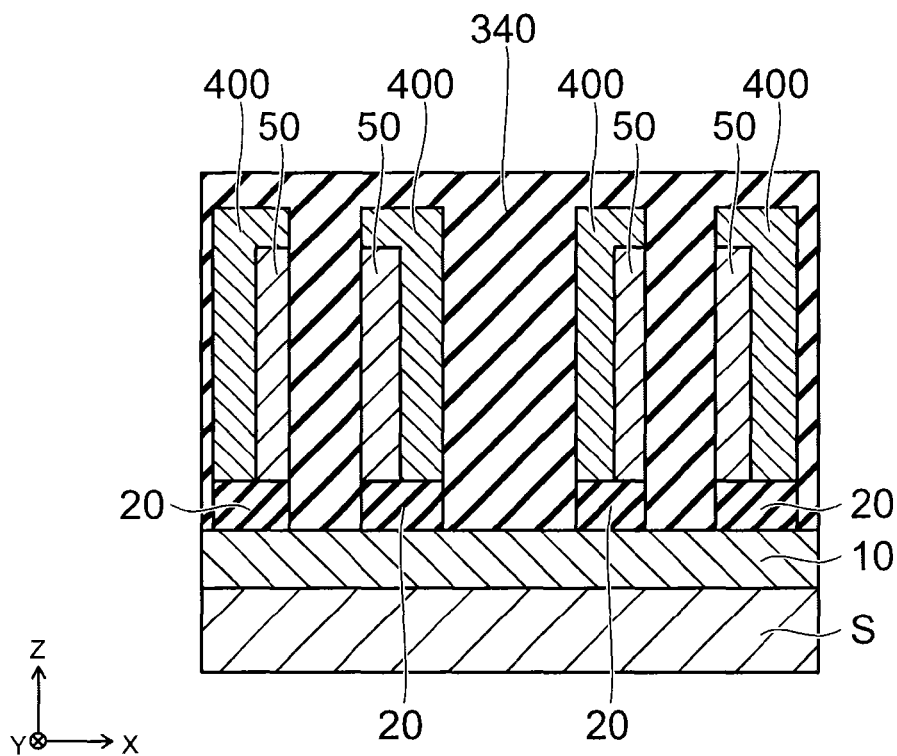

Next, as shown in FIG. 18B, a separation insulating section material film 340 is formed. The separation insulating section material film 340 is embedded between the opposed intermediate layers 50, between the opposed second electrodes 40, and between the divided first resistance change layers 20.

Figure 19A:
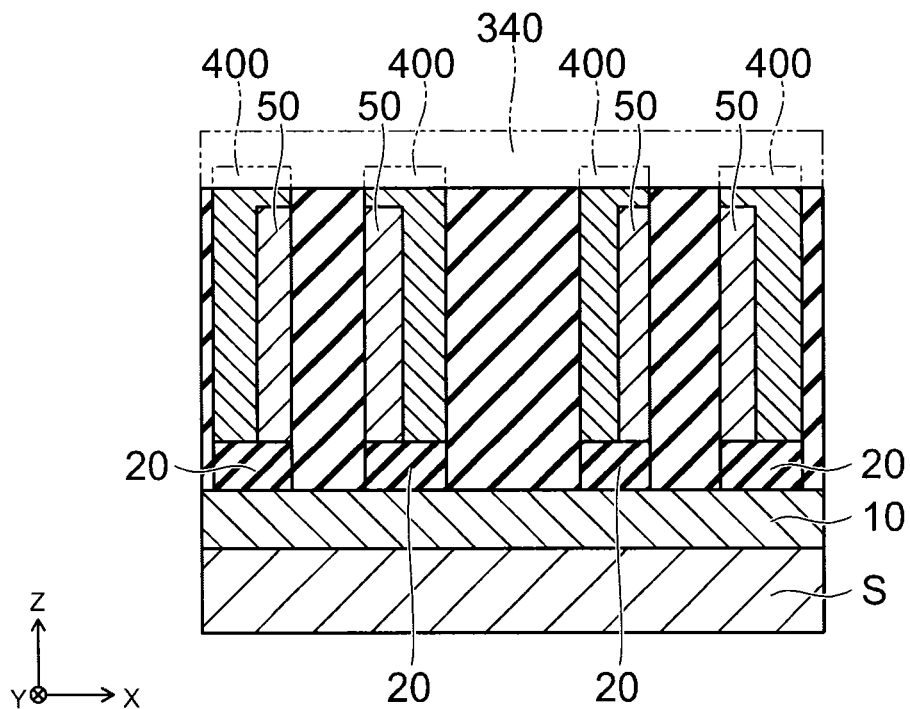
Figure 19B:
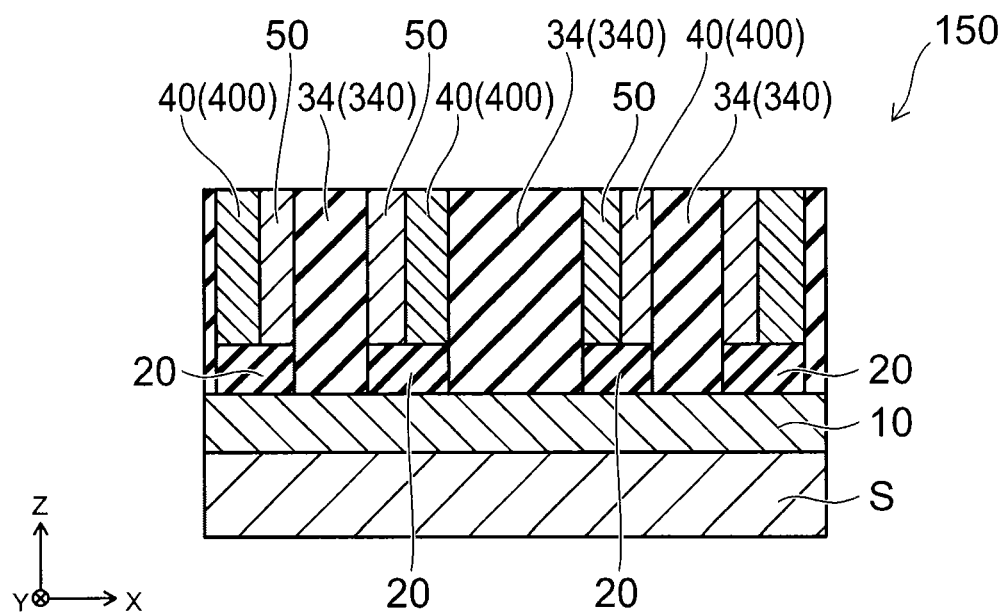

Next, as shown in FIG. 19A, the upper surface of the separation insulating section material film 340 is planarized by e.g. the CMP method. As shown in FIG. 19B, the planarization of the separation insulating section material film 340 is performed until the intermediate layer 50 and the second electrode 40 are exposed. The separation insulating section material film 340 remaining after the planarization constitutes a separation insulating section 34.

Then, similarly to the method for manufacturing the memory device 110 shown in FIGS. 11A and 11B, trimming of electrodes and the like is performed. Thus, the memory device 150 is completed.

Sixth Embodiment

Next, a memory device according to a sixth embodiment is described.

Figure 20A:
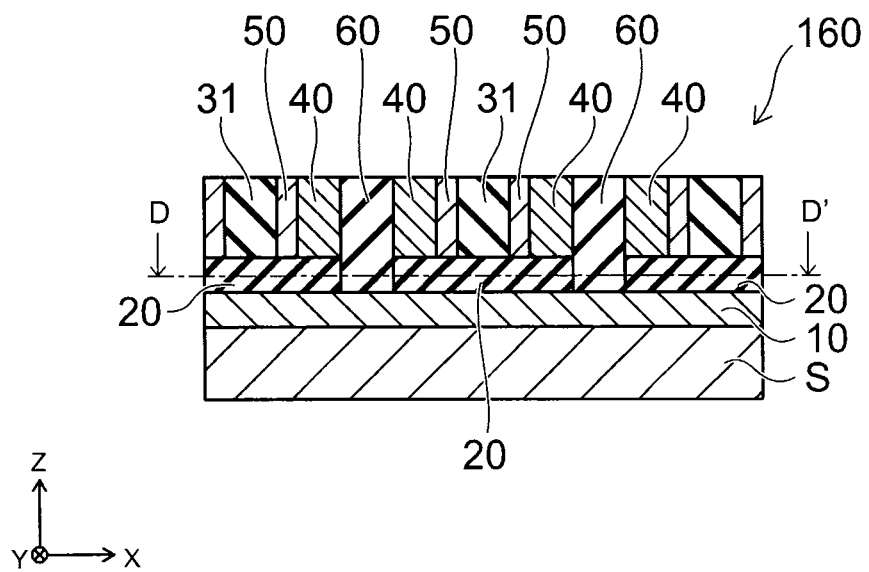
FIGS. 20A and 20B are schematic views illustrating the memory device according to the sixth embodiment.
Figure 20B:
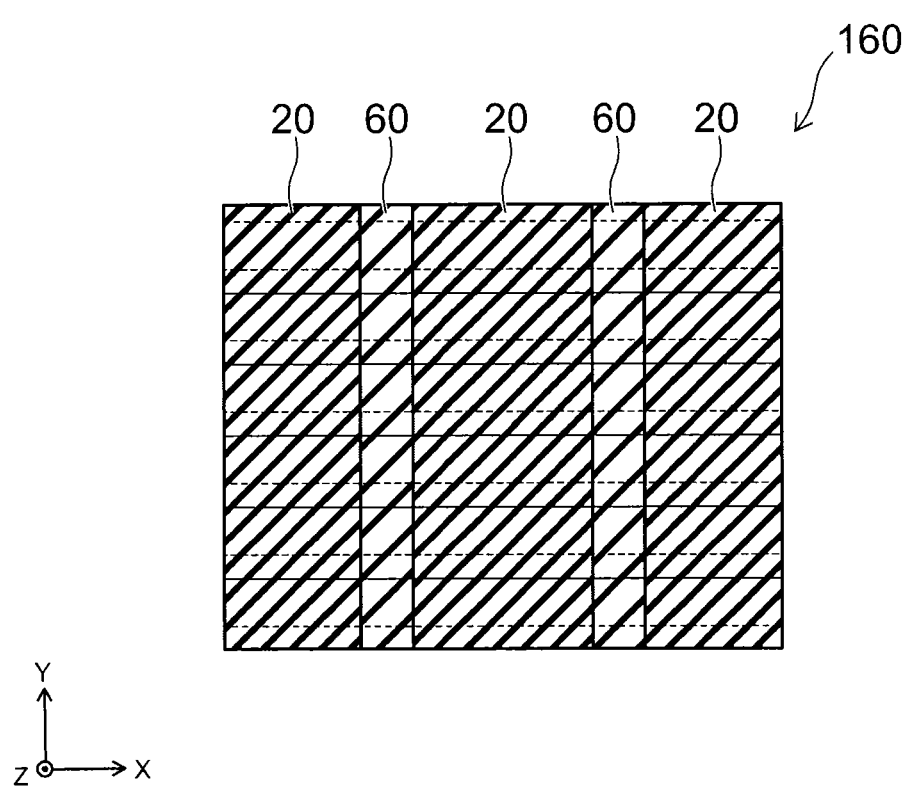

FIGS. 20A and 20B are schematic views illustrating the memory device according to the sixth embodiment.

FIG. 20A shows a schematic sectional view of the memory device 160 according to the sixth embodiment. FIG. 20B shows a schematic sectional view taken along line D-D' shown in FIG. 20A.

As shown in FIGS. 20A and 20B, the memory device 160 includes a second insulating section 60 provided on the first electrode 10. The first resistance change layer 20 is divided by the second insulating section 60.

The first resistance change layer 20 extends in the Y direction. The first resistance change layer 20 is formed like a stripe. In the memory device 160, the first resistance change layer 20 is divided for every two adjacent second electrodes 40. In the memory device 160, the interference effect is reduced between one memory cell and a memory cell adjacent to the one memory cell on one side in the X direction. Thus, the reliability of the memory device 160 is improved.

Next, a method for manufacturing the memory device 160 is described.

FIGS. 21A to 22B are schematic sectional views illustrating the method for manufacturing a memory device according to the sixth embodiment.

Here, part of the method for manufacturing the memory device 110 shown in FIGS. 4A to 8B is in common with part of the method for manufacturing the memory device 160.

Figure 21A:
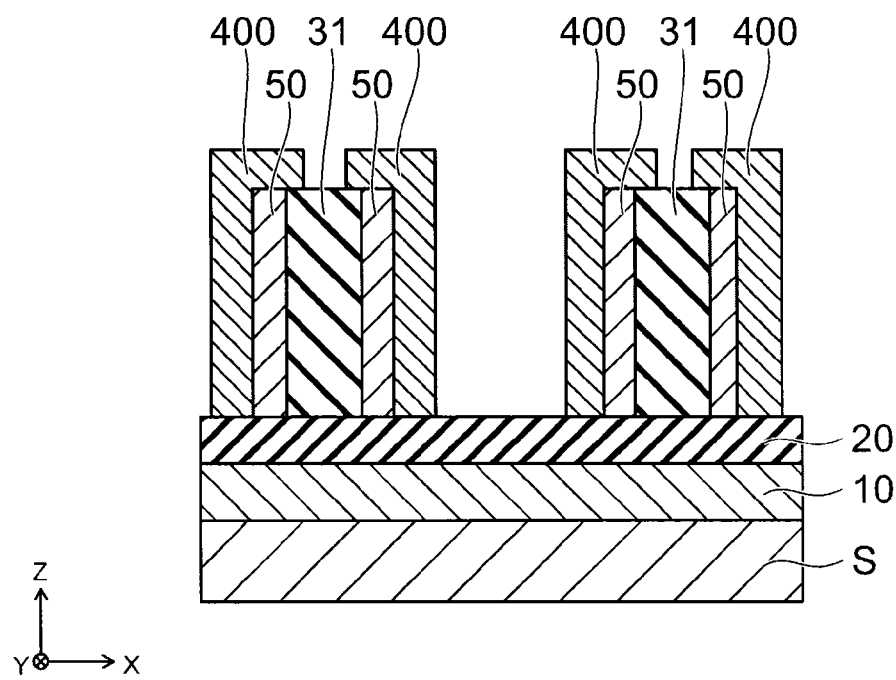
FIGS. 21A to 22B are schematic sectional views illustrating the method for manufacturing a memory device according to the sixth embodiment.
Figure 21B:
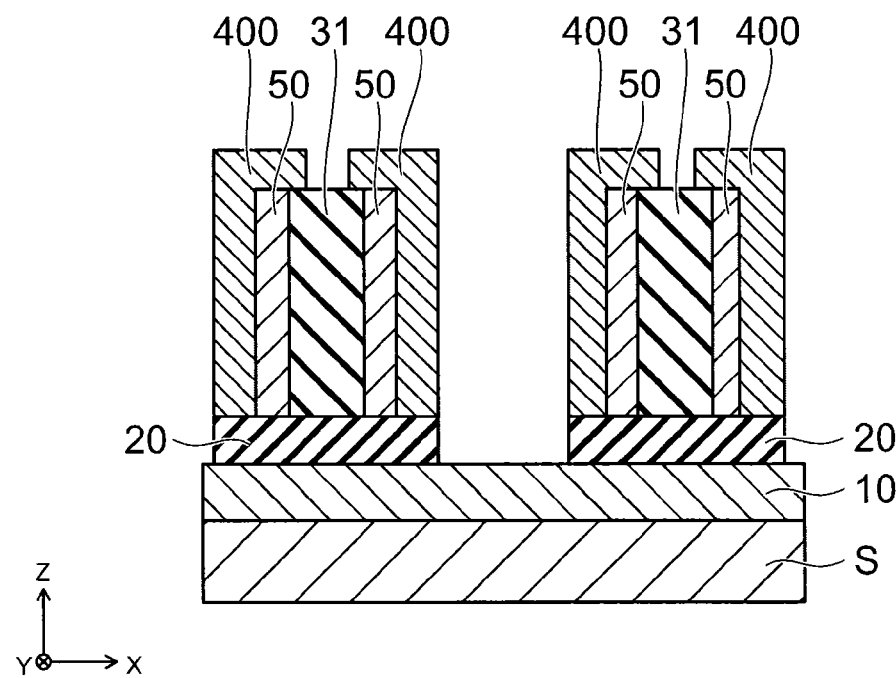

FIG. 21A shows the state in which a second electrode material film 400 is formed. Next, as shown in FIG. 21B, part of the first resistance change layer 20 is removed. The first resistance change layer 20 is partly etched by e.g. RIE. In this etching, the second electrode material film 400 is used as a mask. Thus, the first resistance change layer 20 is divided.

Figure 22A:
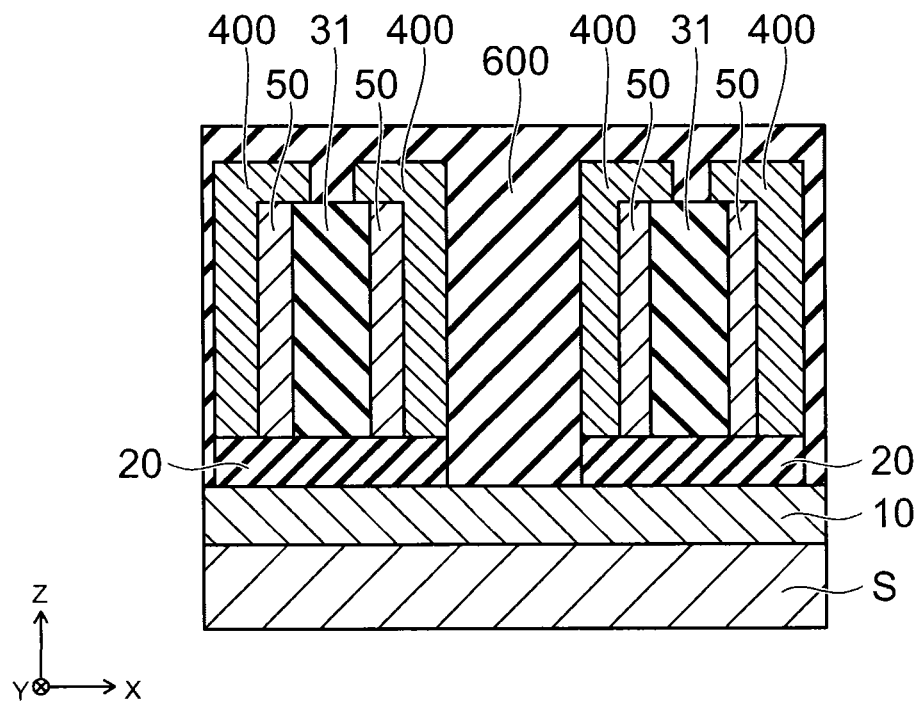

Next, as shown in FIG. 22A, a second insulating section material film 600 is formed. The second insulating section material film 600 is embedded between the second electrodes 40 and between the divided first resistance change layers 20.

Figure 22B:
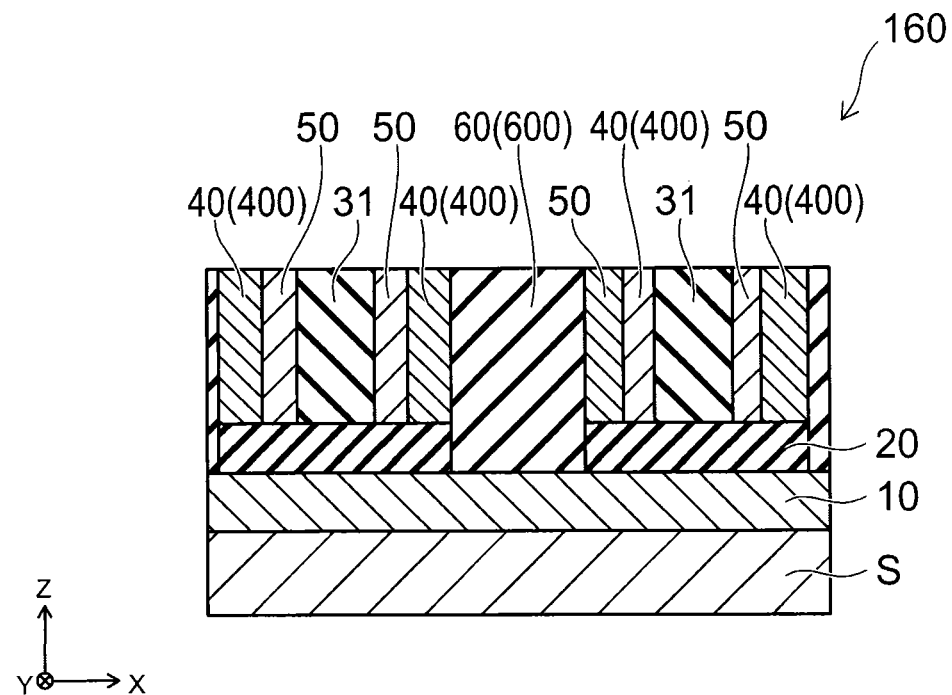

Next, as shown in FIG. 22B, the upper surface of the second insulating section material film 600 is planarized by e.g. the CMP method. The planarization of the second insulating section material film 600 is performed until the first insulating section 31, the intermediate layer 50, and the second electrode 40 are exposed. The second insulating section material film 600 remaining after the planarization constitutes a second insulating section 60.

Then, similarly to the method for manufacturing the memory device 110 shown in FIGS. 11A and 11B, trimming of electrodes and the like is performed. Thus, the memory device 160 is completed.

Compared with the method for manufacturing the memory device 150, the method for manufacturing the memory device 160 does not need the step for removing the first insulating section 31. Thus, compared with the process for manufacturing the memory device 150, the process for manufacturing the memory device 160 is simplified.

Seventh Embodiment

Next, a memory device according to a seventh embodiment is described.

Figure 23:
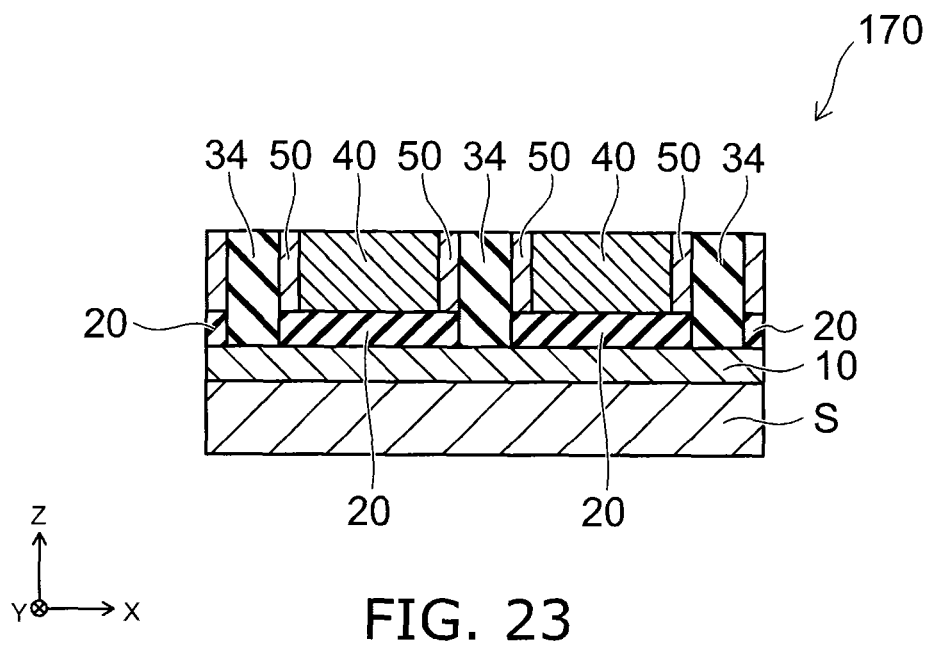
FIG. 23 is a schematic view illustrating the memory device according to the seventh embodiment.

FIG. 23 is a schematic view illustrating the memory device according to the seventh embodiment.

As shown in FIG. 23, the memory device 170 according to the seventh embodiment has a configuration in which the memory device 130 according to the third embodiment shown in FIGS. 13A and 13B is combined with the memory device 150 according to the fifth embodiment shown in FIGS. 16A and 16B.

In the memory device 170, the first insulating section 31 of the memory device 130 is replaced by a separation insulating section 34. The separation insulating section 34 is provided on the first electrode 10. The first resistance change layer 20 is divided by the separation insulating section 34. In the memory device 170, the first resistance change layer 20 is divided by the separation insulating section 34. This reduces the interference effect between adjacent memory cells. Thus, the reliability of the memory device 170 is improved.

Eighth Embodiment

Next, a memory device according to an eighth embodiment is described.

Figure 24:
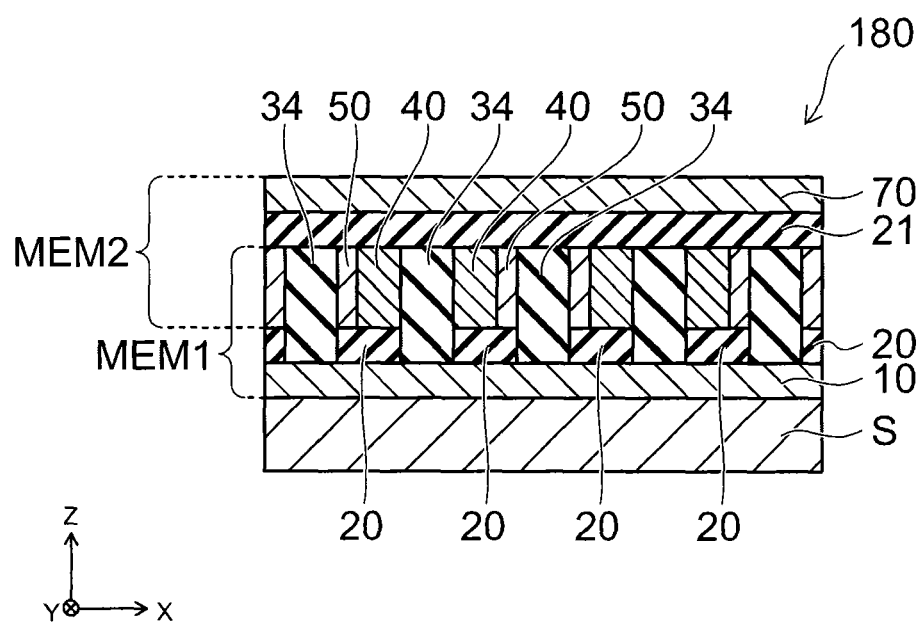
FIG. 24 is a schematic view illustrating the memory device according to the eighth embodiment.

FIG. 24 is a schematic view illustrating the memory device according to the eighth embodiment.

As shown in FIG. 24, the memory device 180 according to the eighth embodiment has a configuration in which the memory layer included in the memory device 150 according to the fifth embodiment shown in FIGS. 16A and 16B is stacked in a plurality of layers.

The memory device 180 includes a first memory layer MEM1 and a second memory layer MEM2. In the first memory layer MEM1 and the second memory layer MEM2, the layer structures are vertically inverted with respect to each other. In the first memory layer MEM1 and the second memory layer MEM2, some of the electrodes are shared.

The memory device 180 has a configuration in which a plurality of memory layers are stacked. In this configuration, some of the electrodes are shared. Thus, a memory device 180 with low cost and high capacity is realized. Furthermore, in each memory layer, the interference effect between adjacent memory cells is reduced. Thus, the reliability of the memory device 180 is improved.

As described above, the memory device and the method for manufacturing the same according to the embodiments can improve the reliability of the memory device.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

For instance, the combination of materials of the first resistance change layer 20, the second electrode 40, and the intermediate layer 50 can be arbitrarily selected depending on the adhesive force between the materials.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
  a first electrode extending in a first direction, the first electrode including a first region and a second region, the second region being arranged beside the first region along the first direction;
  a first separation insulating section provided on the first region
  a second separation insulating section provided on the second region;
  a resistance change layer provided on the first electrode and between the first separation insulating section and the second separation insulating section,
  a second electrode provided on a first part of a top surface of the resistance change layer, the second electrode extending in a second direction crossing the first direction, the second electrode having a first side face crossing the first direction, the first side face being in contact with the first separation insulating section; and
  an intermediate layer provided on a second part of the top surface of the resistance change layer and between the second electrode and the second separation insulating section, the intermediate layer having a second side face crossing the first direction, the second side face being in contact with the second separation insulating section, the intermediate layer extending in the second direction.

2. The device according to claim 1, wherein the second electrode is in contact with the resistance change layer.

3. The device according to claim 2, wherein the intermediate layer is in contact with resistance change layer.

4. The device according to claim 1, wherein resistance of the resistance change layer is changed by a conductive filament in the resistance change layer.

5. The device according to claim 1 wherein the second electrode includes a metal serving as an ion source of ions to be supplied to the resistance change layer.

6. The device according to claim 1, wherein the second electrode includes at least one selected from the group consisting of Ag, Cu, Ni, Co, and Al, and the resistance change layer includes Si.

7. The device according to claim 1, wherein the intermediate layer includes titanium or titanium nitride.

8. The device according to claim 1, wherein thickness of the second electrode in a direction from the first electrode toward the resistance change layer is 10 nanometers or more and 30 nanometers or less.

9. A memory device comprising:
  a first electrode extending in a first direction, the first electrode including a first region and a second region, the second region being arranged beside the first region along the first direction;
  a resistance change layer provided on the first region, the resistance change layer including Si;
  a separation insulating section provided on the second region;
  a second electrode provided on a first part of the resistance change layer, the second electrode extending in a second direction crossing the first direction, the second electrode including at least one selected from the group consisting of Ag, Cu, Ni, Co, and Al; and
  an intermediate layer provided on a second part of a top surface of the resistance change layer and between the second electrode and the separation insulating section, the intermediate layer being in contact with the separation insulating section, the intermediate layer extending in the second direction, the intermediate layer including titanium nitride, the intermediate layer being conductive.

10. The device according to claim 9, wherein the second electrode is in contact with the resistance change layer.

11. The device according to claim 10, wherein the intermediate layer is in contact with the resistance change layer.

12. The device according to claim 9, wherein resistance of the resistance change layer is changed by a conductive filament in the resistance change layer.

13. The device according to claim 9, wherein thickness of the second electrode in a direction from the first electrode toward the resistance change layer is 10 nanometers or more and 30 nanometers or less.

14. The device according to claim 1, wherein the first separation insulating section and the second separation insulating section are in contact with the first electrode.

15. The device according to claim 1, wherein the intermediate layer is in contact with the second electrode.

16. The device according to claim 9, wherein the separation insulating section is in contact with the first electrode.

17. The device according to claim 9, wherein the intermediate layer is in contact with the second electrode.

18. A memory device comprising:
  a first electrode extending in a first direction, the first electrode having a face along the first direction, the face including a first region and a second region; a resistance change layer provided on the first region and being in contact with the face;
  a separation insulating section provided on the second region and being in contact with the face;
  a second electrode provided on a part of the resistance change layer, the second electrode extending in a second direction crossing the first direction; and
  an intermediate layer provided on another part of the resistance change layer and between the second electrode and the separation insulating section, the intermediate layer being in contact with the separation insulating section, the intermediate layer extending in the second direction.

* * * * *